(12) United States Patent
Pilch et al.

(10) Patent No.: US 10,246,782 B2
(45) Date of Patent: Apr. 2, 2019

(54) METHODS FOR ETCHING A WORKPIECE, AN APPARATUS CONFIGURED TO ETCH A WORKPIECE, AND A NON-TRANSITORY COMPUTER READABLE MEDIUM

(71) Applicant: Infineon Technologies AG, Neubiberg (DE)

(72) Inventors: Karl Pilch, Villach (AT); Sonja Muringer, Niederdorf (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 426 days.

(21) Appl. No.: 14/735,209

(22) Filed: Jun. 10, 2015

(65) Prior Publication Data

US 2015/0267304 A1 Sep. 24, 2015

Related U.S. Application Data

(62) Division of application No. 13/947,214, filed on Jul. 22, 2013, now Pat. No. 9,079,210.

(51) Int. Cl.
| | |
|---|---|
| *C23F 1/08* | (2006.01) |
| *B05C 11/00* | (2006.01) |
| *C23F 1/14* | (2006.01) |
| *B05C 5/00* | (2006.01) |
| *B05D 1/00* | (2006.01) |
| *H01L 21/67* | (2006.01) |
| *H01L 21/306* | (2006.01) |

(Continued)

(52) U.S. Cl.
CPC ............... *C23F 1/08* (2013.01); *B05C 5/00* (2013.01); *B05C 11/00* (2013.01); *B05D 1/00* (2013.01); *B05D 1/002* (2013.01); *C23F 1/14* (2013.01); *H01L 21/30604* (2013.01); *H01L 21/6708* (2013.01); *H01L 22/12* (2013.01); *H01L 22/20* (2013.01); *H01L 31/00* (2013.01)

(58) Field of Classification Search
None
See application file for complete search history.

(56) References Cited

U.S. PATENT DOCUMENTS

| | | | | |
|---|---|---|---|---|
| 5,375,064 A | * | 12/1994 | Bollinger | ............. G05B 19/416 |
| | | | | 156/345.24 |
| 6,111,634 A | | 8/2000 | Pecen et al. | |
| 6,808,591 B1 | * | 10/2004 | Phan | ................. H01L 21/67253 |
| | | | | 156/345.24 |

(Continued)

FOREIGN PATENT DOCUMENTS

CN 101527272 A 9/2009

*Primary Examiner* — Sylvia MacArthur
(74) *Attorney, Agent, or Firm* — Viering, Jentschura & Partner mbb

(57) ABSTRACT

A method for etching a workpiece may be provided, which may include: determining a plurality of reference etch profiles for a plurality of positions of an etchant dispenser, each reference etch profile corresponding to a respective position of the plurality of positions of the etchant dispenser; determining a thickness profile of the workpiece; determining a respective etch duration for each position of the plurality of positions of the etchant dispenser based on the determined thickness profile and the plurality of reference etch profiles, to reduce a total thickness variation of the workpiece; and dispensing an etchant over the workpiece via the etchant dispenser for the determined respective etch duration for each position of the plurality of positions.

18 Claims, 15 Drawing Sheets

(51) Int. Cl.
*H01L 31/00* (2006.01)
*H01L 21/66* (2006.01)

(56) References Cited

U.S. PATENT DOCUMENTS

| | | | | |
|---|---|---|---|---|
| 6,984,477 | B2* | 1/2006 | Ogata | G03F 7/162 |
| | | | | 427/8 |
| 7,160,739 | B2* | 1/2007 | Shanmugasundram | |
| | | | | B24B 37/013 |
| | | | | 257/E21.244 |
| 7,972,969 | B2 | 7/2011 | Yang et al. | |
| 8,025,759 | B2* | 9/2011 | Sasaki | B24B 37/042 |
| | | | | 156/345.13 |
| 8,043,467 | B2* | 10/2011 | Nanba | H01L 21/31055 |
| | | | | 118/320 |
| 2003/0000644 | A1* | 1/2003 | Subramanian | G01N 21/4738 |
| | | | | 156/345.24 |
| 2003/0084918 | A1* | 5/2003 | Kim | H01L 21/67173 |
| | | | | 134/1.2 |
| 2005/0000652 | A1* | 1/2005 | Nam | H01L 21/67046 |
| | | | | 156/345.11 |
| 2006/0191637 | A1 | 8/2006 | Zajac et al. | |
| 2007/0175863 | A1* | 8/2007 | Koyata | H01L 21/02019 |
| | | | | 216/84 |
| 2008/0185103 | A1* | 8/2008 | Bornstein | H01L 21/28035 |
| | | | | 156/345.24 |
| 2009/0227047 | A1* | 9/2009 | Yang | H01L 21/30604 |
| | | | | 438/8 |
| 2012/0103520 | A1* | 5/2012 | Lee | C03C 15/02 |
| | | | | 156/345.15 |
| 2013/0034918 | A1* | 2/2013 | Dusemund | G01N 21/55 |
| | | | | 438/8 |
| 2014/0242731 | A1* | 8/2014 | Mauer | H01L 22/12 |
| | | | | 438/8 |
| 2015/0267304 | A1* | 9/2015 | Pilch | H01L 21/30604 |
| | | | | 156/345.15 |

* cited by examiner

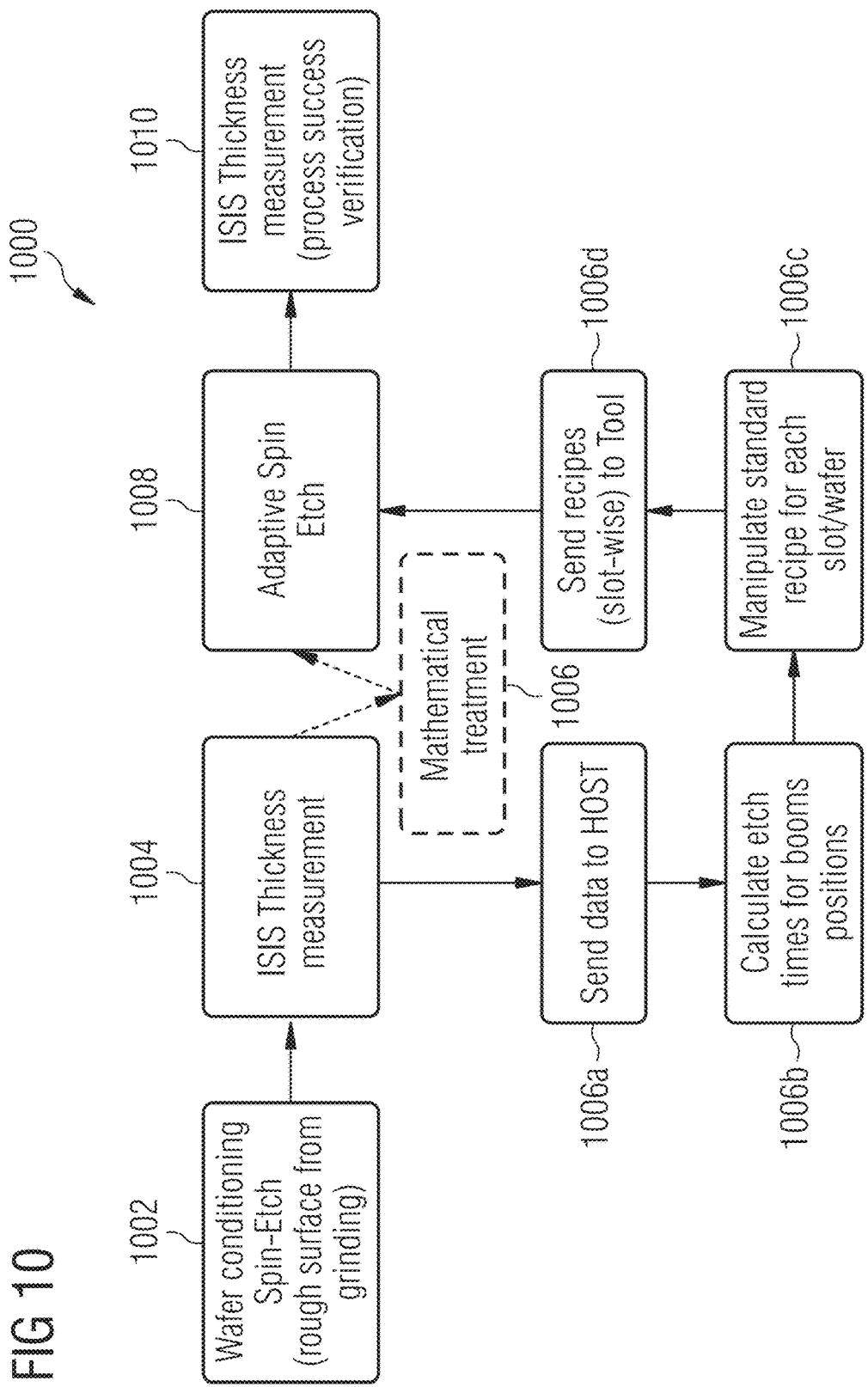

METHODS FOR ETCHING A WORKPIECE, AN APPARATUS CONFIGURED TO ETCH A WORKPIECE, AND A NON-TRANSITORY COMPUTER READABLE MEDIUM

CROSS-REFERENCE TO RELATED APPLICATION

This application is a divisional of U.S. patent application Ser. No. 13/947,214, filed on Jul. 22, 2013, the contents of which are incorporated herein by reference in its entirety for all purposes.

TECHNICAL FIELD

Various aspects relate to methods for etching a workpiece and an apparatus configured to etch a workpiece, and a non-transitory computer readable medium.

BACKGROUND

Workpieces may be included or used in a wide range of devices (e.g. solar panels) that may be used in many technologies or industries (e.g. power industry, e.g. power application industry). The workpiece may include, or may be, a wafer (e.g. a semiconductor wafer, e.g. a silicon wafer) and/or a carrier (e.g. a glass carrier).

The lifetime, reliability and/or performance (e.g. electrical performance, speed, capacity, etc.) of a workpiece and/or a device (e.g. a solar panel) including or produced from the workpiece may depend on a uniformity of a thickness of the workpiece, which may be quantified by the total thickness variation of the workpiece. The lifetime, reliability and/or performance of the workpiece and/or the device including or produced from the workpiece may be improved in case the total thickness variation of the workpiece is reduced or minimized. In other words, a workpiece with a more uniform thickness across it may increase the lifetime, reliability and/or performance of the workpiece and/or the device including or produced from the workpiece. Alternatively, or in addition, the lifetime, reliability and/or performance of the workpiece and/or the device including or produced from the workpiece may be improved in case a thickness of the workpiece is at least substantially equal to a predetermined target thickness, which may be specified in order to provide longer lifetime, greater reliability and/or better performance of the workpiece and/or the device including or produced from the workpiece.

The thickness and/or total thickness variation of the workpiece may depend on processes performed on the workpiece, such as thinning the workpiece. Current methods for thinning the workpiece may not be sufficient to provide the total thickness variation and/or the predetermined target thicknesses that may be needed for the required lifetime, reliability and/or performance of workpieces and/or devices as technology advances. New ways of thinning a workpiece may be needed.

SUMMARY

A method for etching a workpiece may be provided, which may include: determining a plurality of reference etch profiles for a plurality of positions of an etchant dispenser, each reference etch profile corresponding to a respective position of the plurality of positions of the etchant dispenser; determining a thickness profile of the workpiece; determining a respective etch duration for each position of the plurality of positions of the etchant dispenser based on the determined thickness profile and the plurality of reference etch profiles, to reduce a total thickness variation of the workpiece; and dispensing an etchant over the workpiece via the etchant dispenser for the determined respective etch duration for each position of the plurality of positions.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 10 shows a flow diagram that shows an example of a method for etching a workpiece.

DESCRIPTION

Figure 1A:
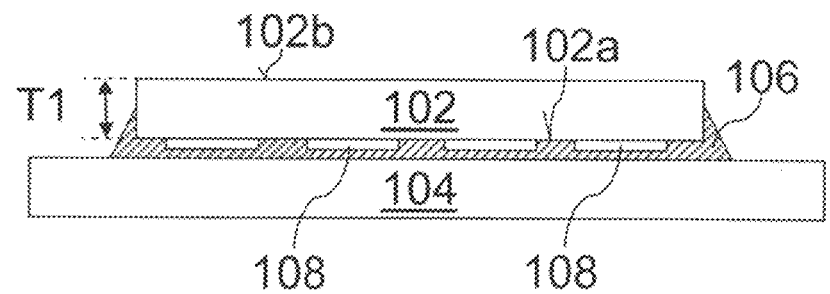
FIG. 1A to FIG. 1D show a conventional method for thinning a workpiece.

The following detailed description refers to the accompanying drawings that show, by way of illustration, specific details and aspects in which the invention may be practised. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described for structures or devices, and various aspects are described for methods. It may be understood that one or more (e.g. all) aspects described in connection with structures or devices may be equally applicable to the methods, and vice versa.

The word "exemplary" is used herein to mean "serving as an example, instance, or illustration". Any aspect or design described herein as "exemplary" is not necessarily to be construed as preferred or advantageous over other aspects or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on"

the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

Workpieces, e.g. wafers (such as semiconductor wafers, e.g. silicon wafers) and/or carriers (such as glass carriers), are widely used for fabrication of devices used in a broad range of technologies and industries, including, but not limited to, the mobile communications industry (e.g. in network components, mobile devices, etc.), the transportation industry (e.g. in airplanes, automobiles, etc.), and the power generation, distribution, and applications industries (e.g. in solar panels). Consequently, workpieces (e.g. wafers and/or carriers) may be included or used in a wide range of devices (e.g. solar panels) that may be used in many technologies or industries (e.g. power industry, e.g. power application industry).

A workpiece (e.g. wafer and/or carrier) may need to be thinned during some stage of the workpiece processing, e.g. in order for the workpiece and/or the device including or produced from the workpiece to conform to specifications (e.g. size, e.g. thickness) and/or electrical parameters.

FIG. 1A to FIG. 1D show a conventional method for thinning a workpiece.

FIG. 1A shows a workpiece 102 disposed over a carrier 104.

The carrier 104 (e.g. glass carrier) may be configured to provide support (e.g. mechanical support) to the workpiece 102, for example, during a subsequent thinning of the workpiece 102. The workpiece 102 may be disposed over the carrier 104 and may be mounted onto the carrier 104. For example, the workpiece 102 may be attached to the carrier 104 by means of an adhesive 106 (e.g. non-conductive adhesive, e.g. glue, tape, foil, or the like), which may be disposed between the workpiece 102 and the carrier 104 (e.g. glass carrier) as shown in FIG. 1A.

The workpiece 102 may include, or may be, a wafer. In such an example, the workpiece 102 (e.g. wafer) may include a semiconductor substrate, which may include, or may consist of, a semiconductor material. In such an example, the workpiece 102 (e.g. wafer) may include one or more semiconductor material layers. The semiconductor material may include, or may be, at least one material selected from a group of materials, the group consisting of: silicon, germanium, gallium nitride, gallium arsenide, and silicon carbide, although other materials may be possible as well. In another example, the workpiece 102 may include, or may be, a carrier. In such an example, the workpiece 102 (e.g. carrier) may include, or may be, a glass carrier. In yet another example, the workpiece 102 may include, or may be, a carrier (e.g. a glass carrier) having one or more layers (e.g. one or more semiconductor layers) disposed over the carrier (e.g. glass carrier). In a further example, the workpiece 102 may include, or may be, a carrier (e.g. a glass carrier) having one or more wafers (e.g. one or more semiconductor wafers) disposed over the carrier (e.g. glass carrier). The description that follows considers examples where the workpiece 102 may include, or may be, a wafer (e.g. semiconductor wafer). However, it is reiterated that the workpiece 102 may include, or may be, other types of workpiece, e.g. a carrier (e.g. glass carrier).

The workpiece 102 may include a first side 102a and a second side 102b opposite the first side 102a. The first side 102a and the second side 102b of the workpiece 102 may include, or may be, a frontside and a backside of the workpiece 102, respectively. By way of another example, the first side 102a of the workpiece 102 may include, or may be, an active side of the workpiece 102. The workpiece 102 may have a thickness T1, which may, for example, include, or may be, a distance between the first side 102a and the second side 102b of the workpiece 102.

As described above, the workpiece 102 may include, or may be, a wafer (e.g. a semiconductor wafer, e.g. a silicon wafer). In such an example, the workpiece 102 (e.g. wafer) may include at least one semiconductor device 108. Only four semiconductor devices 108 are shown as an example, however the number of semiconductor devices 108 may be less than four (e.g. one, two, three) or may be more than four, e.g. five, six, seven, eight, nine, tens, hundreds, or thousands of semiconductor devices 108. For example, the workpiece 102 (e.g. wafer) may include a plurality of semiconductor devices 108 arranged laterally adjacent to each other and/or as a matrix of semiconductor devices 108. In another example where the workpiece 102 may include, or may be, a carrier (e.g. glass carrier), the workpiece 102 may not include the at least one semiconductor device 108.

The at least one semiconductor device 108 may, for example, be configured for use in a device in which the workpiece 102 (e.g. wafer) may be included or for the production of which the workpiece 102 (e.g. wafer) may be used. For example, the workpiece 102 (e.g. wafer), or at least a part of the workpiece 102 (e.g. wafer), may be subsequently included in (e.g. may be a part of) a solar panel. In such an example, the at least one semiconductor device 108 may include, or may be, at least one photovoltaic cell.

The at least one semiconductor device 108 may be disposed at the first side 102a (e.g. active side) of the workpiece 102 (e.g. wafer), as shown in FIG. 1A. In another example, the at least one semiconductor device 108 may be disposed at the second side 102b (e.g. backside) of the workpiece 102 (e.g. wafer).

The side of the workpiece 102 at which the at least one semiconductor device 108 may be disposed may face the carrier 104. For instance, in the example shown in FIG. 1A, the first side 102a of the workpiece 102 may face the carrier 104. Thinning the workpiece 102 may include removing material (e.g. semiconductor material) from the side of the workpiece 102 opposite the side at which the at least one semiconductor device 108 may be disposed. For instance, in the example shown in FIG. 1A, thinning the workpiece 102 may include removing material (e.g. semiconductor material) from the second side 102b (e.g. backside) of the workpiece 102 facing away from the carrier 104.

Figure 1B:
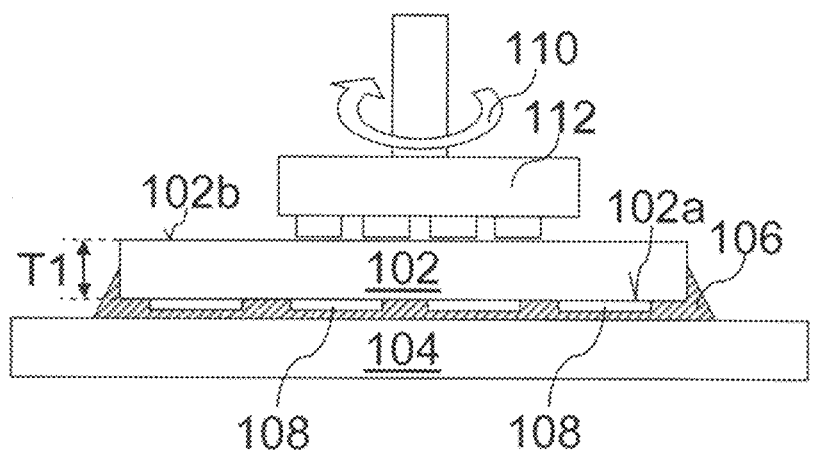

As shown in FIG. 1B, a grinding process (indicated by arrow 110) may be performed on the workpiece 102. The grinding process 110 may be performed by means of a workpiece grinder 112, which may be configured to remove material (e.g. semiconductor material) from the workpiece, e.g. from the side of the workpiece 102 facing away from the carrier 104 (e.g. the second side 102b according to the example shown in FIG. 1B). In other words, the grinding process (indicated by arrow 110) may reduce the thickness T1 of the workpiece 102.

Figure 1C:
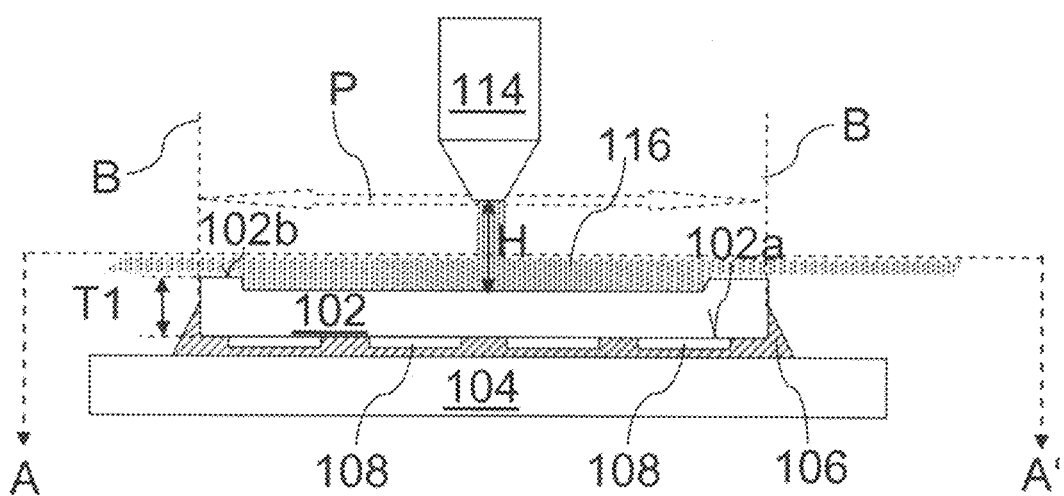

FIG. 1C shows an etching process (e.g. spin-etch process, e.g. wet spin-etch process, e.g. a wet chemical spin-etch process) that may be performed on the workpiece 102, e.g. subsequent to the grinding process 110. The etching process (e.g. spin-etch process) may be performed by means of an etchant dispenser 114, which may be configured to dispense an etchant 116 (e.g. a liquid etchant, e.g. a chemical etchant), and which may be positioned above the workpiece 102. The etchant dispenser 114 may also be referred to as a media dispense boom.

The grinding process 110 shown in FIG. 1B may cause damage (e.g. crystal damage) to the workpiece 102 (e.g. the second side 102b of the workpiece 102). The etching process (e.g. spin-etch process) may remove the damage (e.g. crystal damage) caused by the grinding process 110.

Figures 1, 4A:
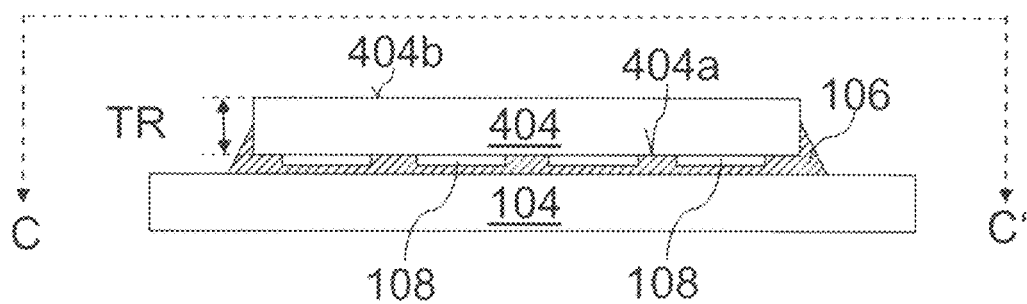
FIG. 4A-1 to FIG. 4E show a process flow for determining the plurality of reference etch profiles for a plurality of positions of an etchant dispenser.
Figures 2, 4A:
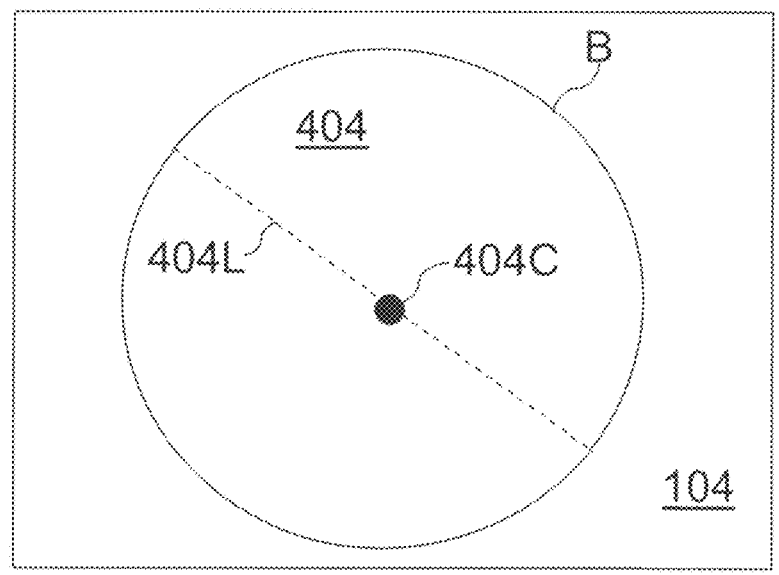
Figures 3, 4A:
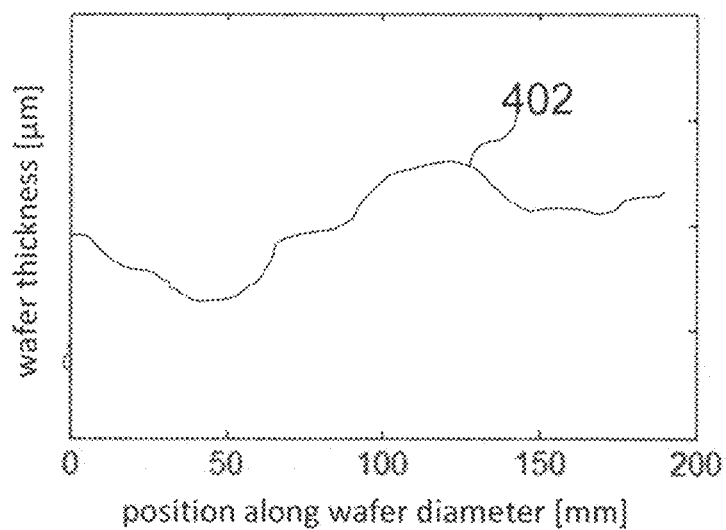

The etching process (e.g. spin-etch process) may remove material (e.g. semiconductor material) from the side of the workpiece 102 facing away from the carrier 102 (e.g. the second side 102b according to the example shown in FIG. 1). The etching process (e.g. spin-etch process) may remove about 10 μm to about 60 μm of material (e.g. semiconductor material, e.g. silicon) from the workpiece 102, e.g. from the second side 102b of the workpiece 102 according to the example shown in FIG. 1C. In accordance with other examples, the etching process may remove a different amount of material from the workpiece 102, for example less than 10 μm or more than 60 μm of material.

The workpiece 102 may be rotated (e.g. spun) while the etchant 116 (e.g. liquid etchant, e.g. chemical etchant) is dispensed over the workpiece 102. Furthermore, the etchant dispenser 114 (e.g. media dispense boom) may move to-and-fro (e.g. continuously) along a path P above the workpiece 102, which may be disposed laterally within a boundary B of the workpiece 102.

The etchant dispenser 114 may be located at a fixed height above the workpiece 102, and may move to-and-fro (e.g. continuously) along a path P above the workpiece 102. For example, the path P along which the etchant dispenser 114 moves above the workpiece 102 may be at a fixed height H above the workpiece 102.

Figure 1D:
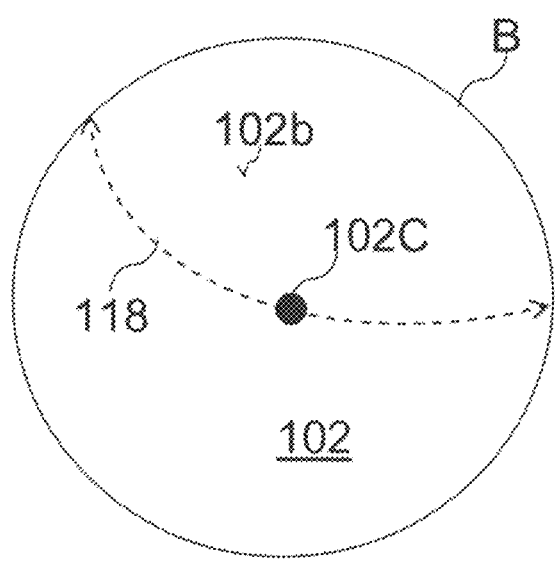

FIG. 1D shows a view of the workpiece 102 along the line A-A' shown in FIG. 1C.

As shown in FIG. 1D, the workpiece 102 may be a circular workpiece. A projection of path P onto a surface of the workpiece 102 (e.g. onto the second side 102b of the workpiece 102) may trace an arc 118 that may pass through a center 102C of the workpiece 102, and may be disposed laterally within the boundary B of the workpiece 102.

Figure 2:
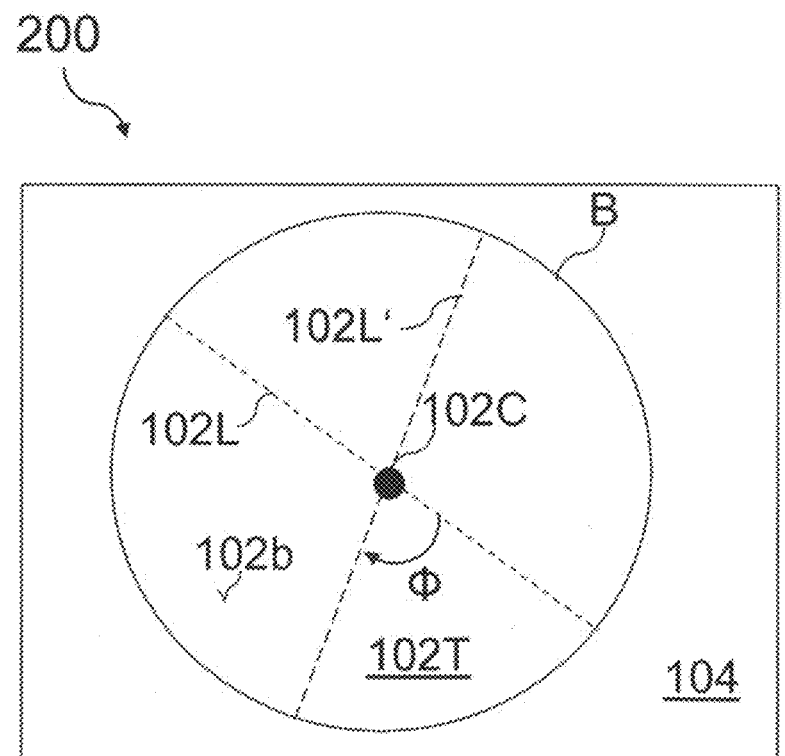
FIG. 2 shows a plan view of a thinned workpiece, a thickness profile of the thinned workpiece, and a total thickness variation of the thinned workpiece.
Figure 2:
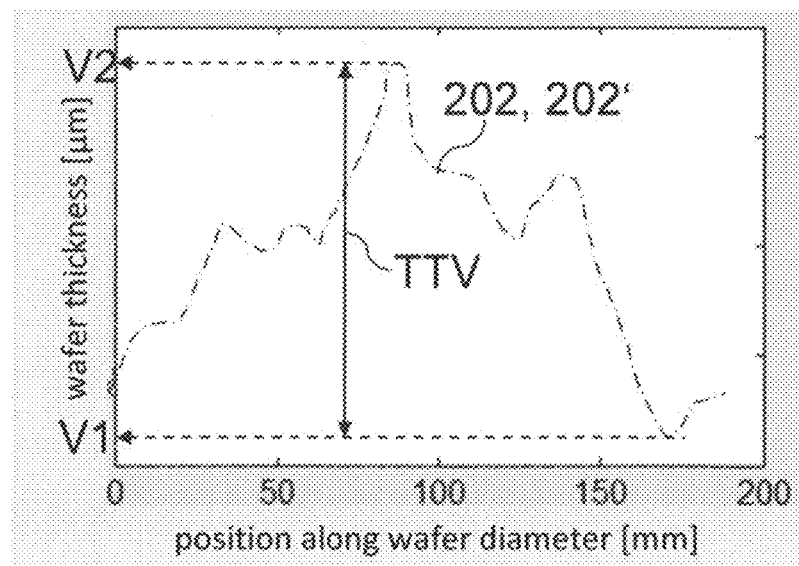

A result the conventional method for thinning the workpiece 102 may be the thinned workpiece 102T shown in FIG. 2.

FIG. 2 shows a plan view 200 of the thinned workpiece 102T, the thickness profile 202 of the thinned workpiece 102T, and the total thickness variation TTV of the thinned workpiece 102T.

Reference signs in FIG. 2 that are the same as in FIG. 1A to FIG. 1D denote the same or similar elements as in FIG. 1A to FIG. 1D. Thus, those elements will not be described in detail again here; reference is made to the description above.

The thickness profile 202 of the thinned workpiece 102T may refer to a thickness of the thinned workpiece 102T along a line 102L passing through the center 102C of the thinned workpiece 102T. In other words, the thickness profile 202 of the thinned workpiece 102T may indicate how the thickness of the thinned workpiece 102T varies along the line 102L passing through the center 102C of the thinned workpiece 102T. In an example where the thinned workpiece 102T may be a circular workpiece (or an at least substantially circular workpiece), as in the example shown in FIG. 2, the line 102L passing through the center 102C of the thinned workpiece 102T may be a diameter of the thinned workpiece 102T. Accordingly, the thickness profile 202 of the thinned workpiece 102T may indicate how the thickness of the thinned workpiece 102T varies along the diameter of the thinned workpiece 102T.

The thickness profile 202 of the thinned workpiece 102T may be determined from a side of the thinned workpiece 102T facing away from the carrier 104. For instance, in the example shown in FIG. 2, the thickness profile 202 of the thinned workpiece 102T may be determined from the second side 102b (e.g. backside) of the thinned workpiece 102T. In another example, the thickness profile 202 of the thinned workpiece 102T may be determined from the first side 102a (e.g. frontside) of the thinned workpiece 102T, e.g. in an example where the workpiece 102 may include, or may be, a wafer and where the at least one semiconductor device 108 may be disposed at the second side 102b (e.g. backside) of the thinned workpiece 102T.

The thickness of the thinned workpiece 102T, and hence, the thickness profile 202 of the thinned workpiece 102T, may be determined (e.g. measured and/or sensed) by means of a contactless measurement process and/or a contact measurement process. For example, a contactless measurement process may include, or may be, at least one of an infrared interference measurement process, a capacitance measurement process, and an inductance measurement process, although other contactless measurement processes for determining the thickness of the thinned workpiece 102T, and hence, the thickness profile 202 of the thinned workpiece 102T, may be used as well. By way of another example, a contact measurement process may include, or may be, a mechanical tweezer measurement process. In such an example, the contact measurement process may include contacting at least one side (e.g. the first side 102a and/or the second side 102b) of the thinned workpiece 102T with one or more needles and/or tweezers and/or calipers. It may be noted that other contact measurement processes for determining the thickness of the thinned workpiece 102T, and hence, the thickness profile 202 of the thinned workpiece 102T, may be used as well.

As described above, the thinned workpiece 102T may be a circular workpiece. In such an example, the thickness of the thinned circular workpiece may exhibit at least substantial radial symmetry. Stated in another way, the circular workpiece may be at least substantially radially symmetric with respect to its thickness. For example, the thickness profile 202 of the thinned workpiece 102T determined along the line 102L (e.g. a first diameter of the workpiece 102T passing through the center 102C of the thinned workpiece 102T) may be at least substantially identical to the thickness profile 202' of the thinned workpiece 102T determined along another line 102L' (e.g. a second diameter of the workpiece 102T passing through the center 102C of the thinned workpiece 102T and oriented at a polar angle φ (0<φ<180°) with respect to the line 102L).

The total thickness variation (TTV) of the thinned workpiece 102T may refer to the maximum variation in the thickness of the thinned workpiece 102T along the line 102L. For example, the thickness profile 202 of the thinned workpiece 102T along the line 102L may vary between a minimum value V1 and a maximum value V2, as shown in FIG. 2. The TTV of the thinned workpiece 102T may, for example, be expressed as the difference between the maximum value V2 and the minimum value V1, i.e. TTV=V2−V1.

The TTV of the thinned workpiece 102T may be an indication of a homogeneity of the thickness of the thinned workpiece 102T along the line 102L or over the area of the workpiece 102. For example, a larger TTV may indicate low homogeneity of the thickness of the thinned workpiece 102T, while a smaller TTV may indicate high homogeneity of the thickness of the thinned workpiece 102T.

The lifetime, reliability, and/or performance (e.g. electrical performance, speed, capacity, etc.) of a device (e.g. a solar panel) including or produced from the thinned workpiece 102T may depend on the thickness profile 202 and/or the TTV of the thinned workpiece 102T included in or used for the device (e.g. solar panel). For example, in power application devices (e.g. solar panels), the thickness profile 202 and/or the TTV of the thinned workpiece 102T may be critically important to the devices (e.g. solar panels). To improve the lifetime, reliability, and/or performance (e.g. electrical performance, speed, capacity, etc.) of such devices (e.g. solar panel), the thickness T2 of the thinned workpiece 102T may have to be well within certain limits. For example, a current specification for a thinned workpiece 102T used in a solar panel allows a maximum TTV of about 6 μm. In other words, a thickness difference between the thickest part of the workpiece and the thinnest part of the workpiece should be 6 μm or less. Future specifications and/or specifications for other devices may be even more demanding.

The thickness profile 202 and/or the TTV of the thinned workpiece 102T may depend on the thinning process or processes performed on the workpiece 102. As shown in FIG. 1A to FIG. 1D, thinning the workpiece 102 may include mounting the workpiece 102 onto the carrier 104 (e.g. as shown in FIG. 1A), grinding the workpiece 102 (e.g. as shown in FIG. 1B), and etching the workpiece 102 (e.g. as shown in FIG. 1C).

Mounting the workpiece 102 onto the carrier 104 (e.g. as shown in FIG. 1A) may result in a first TTV of the workpiece 102, for example, when the surface of the carrier 104 on which the workpiece 102 is mounted is uneven. Grinding the workpiece 102 (e.g. as shown in FIG. 1B) may contribute additional thickness variations to the workpiece 102, and may result in a second TTV of the workpiece 102. Etching the workpiece 102 (e.g. as shown in FIG. 1C) may contribute yet another thickness variation to the workpiece 102, and may result in a third (final) TTV of the workpiece 102. That is, each of the aforementioned processes (mounting, grinding, etching) may contribute to the final TTV of the workpiece 102.

As described above, the lifetime, reliability, and/or performance (e.g. electrical performance, speed, capacity, etc.) of a device (e.g. a solar panel) including or produced from the thinned workpiece 102T may be improved in case the TTV of the thinned workpiece 102T is reduced or minimized. Conversely, the thinned workpiece 102T may have a TTV that may be out of a specified range of TTVs (namely, larger than the specified range of TTVs), and this may lead to workpiece loss.

One possibility to decrease the TTV of the thinned workpiece 102T may be to minimize the TTV added by each process of the aforementioned processes. In other words, the first, second, and third TTVs obtained by mounting, grinding, and etching, respectively, may be minimized individually. However, the interactions between and/or among the first, second, and third TTVs may not be predicted in advance, and the individually minimized TTVs may, instead, add up constructively, and may result in a large TTV of the thinned workpiece 102T.

In view of the above-mentioned features of the conventional method for thinning the workpiece 102 (e.g. shown in FIG. 1A to FIG. 1D), and the thickness profile 202 and TTV of the thinned workpiece 102T (e.g. shown in FIG. 2), the following needs may be identified:

There may be a need to provide a method for etching a workpiece that may account and compensate for total thickness variations contributed to the workpiece by processes performed on the workpiece prior to the etching.

There may be a need to provide a method for etching a workpiece (e.g. wafer) that may reduce the total thickness variation of layers (e.g. semiconductor material layers) of the workpiece (e.g. wafer).

There may be a need to provide a method for etching a workpiece that may provide a workpiece that may have a thickness that may be at least substantially equal to a predetermined target thickness.

There may be a need to provide a method for etching a workpiece that reduces or minimizes the total thickness variation of the etched workpiece.

The aforementioned need may, for example, be met by a method for etching a workpiece in accordance with one or more embodiments.

An aspect of one or more embodiments may be seen in that the etching of a workpiece may be based on the thickness profile and/or the total thickness variation of the workpiece just prior to the etching.

An aspect of one or more embodiments may be that the etching of a workpiece may remove material (e.g. semiconductor material) from the workpiece to reduce or minimize the total thickness variation of the etched workpiece based on the thickness profile and/or the total thickness variation of the workpiece just prior to the etching.

An aspect of one or more embodiments may be seen in that an adjustment (e.g. a global adjustment) of an etch duration may be made so that a predetermined target thickness of the workpiece may be achieved.

Figure 3:
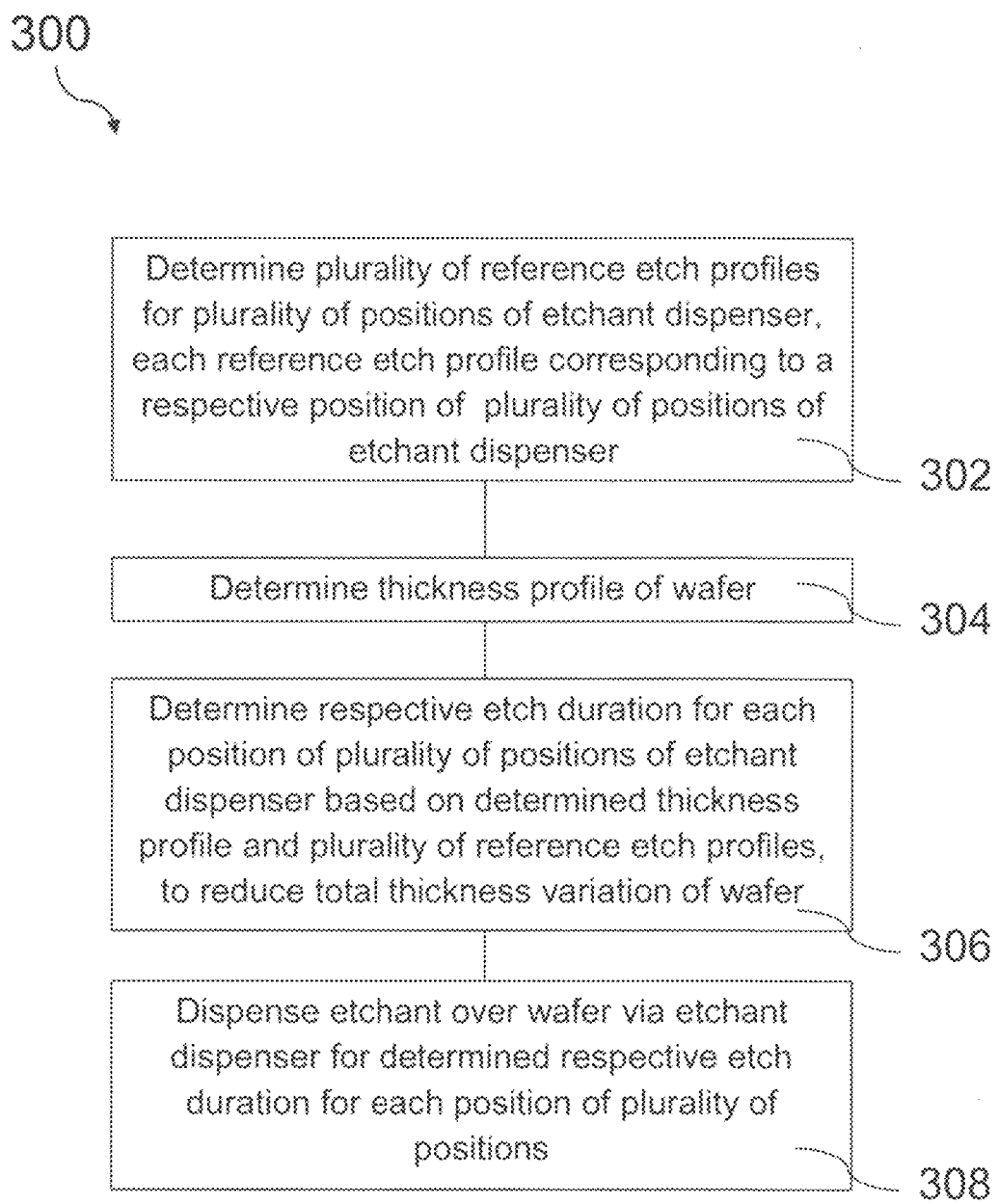
FIG. 3 shows a method for etching a workpiece.

FIG. 3 shows a method 300 for etching a workpiece.

The method 300 may, for example, be used in place of the etching process (e.g. spin-etch process) shown in FIG. 1C. In other words, the method 300 for etching a workpiece may be performed after the mounting process (e.g. shown in FIG. 1A) and the grinding process (e.g. shown in FIG. 1B).

The method 300 may include: determining a plurality of reference etch profiles for a plurality of positions of an etchant dispenser, each reference etch profile corresponding to a respective position of the plurality of positions of the etchant dispenser (in 302); determining a thickness profile of the workpiece (in 304); determining a respective etch duration for each position of the plurality of positions of the etchant dispenser based on the determined thickness profile and the plurality of reference etch profiles, to reduce a total thickness variation of the workpiece (in 306); and dispensing an etchant over the workpiece via the etchant dispenser for the determined respective etch duration for each position of the plurality of positions (in 308).

As described above, the method 300 for etching a workpiece may include: determining the plurality of reference etch profiles for the plurality of positions of the etchant dispenser (in 302).

Figures 1, 4B:
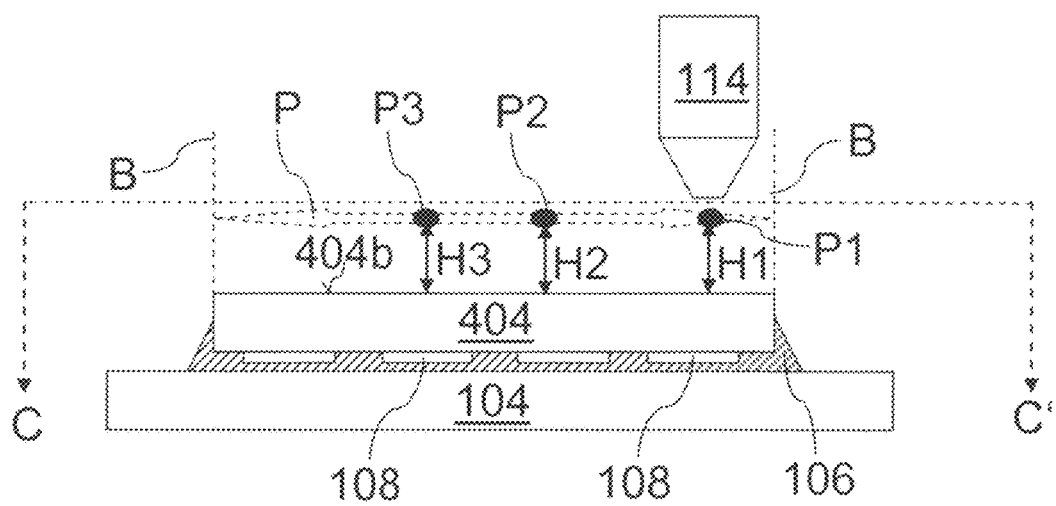
Figures 2, 4B:
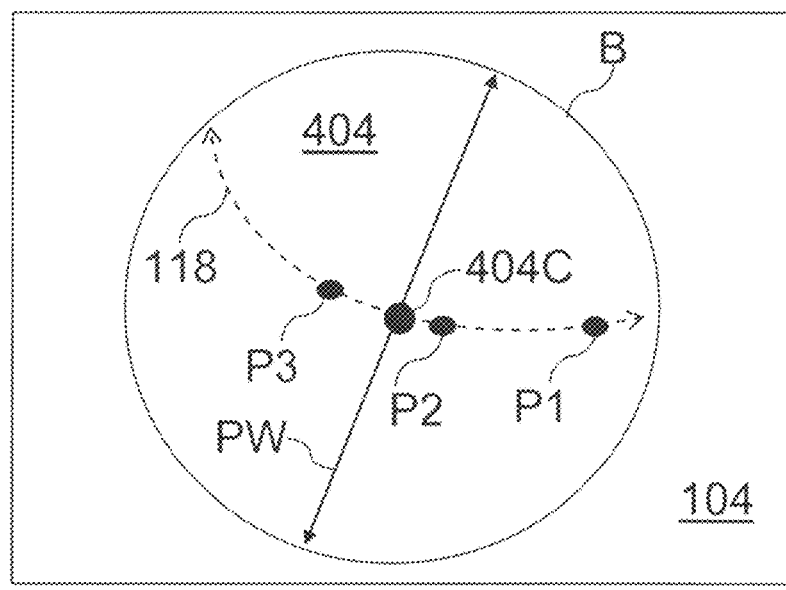
Figure 4C:
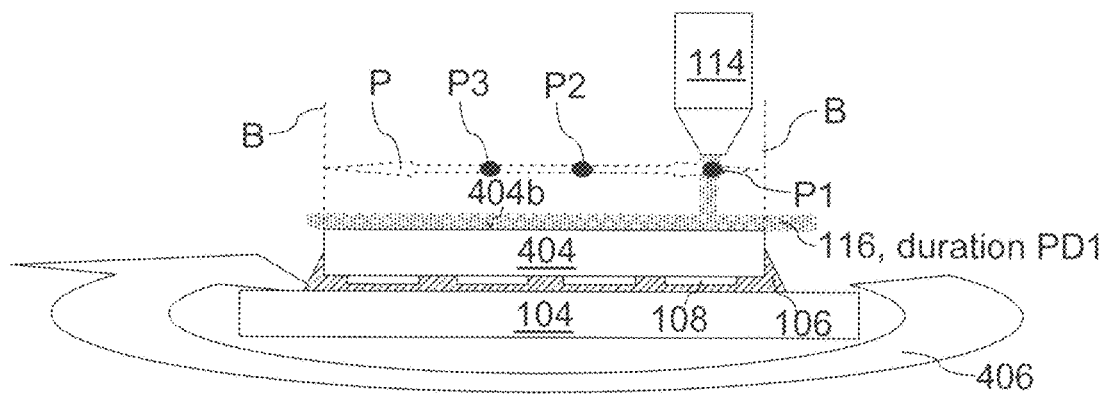
Figure 4D:
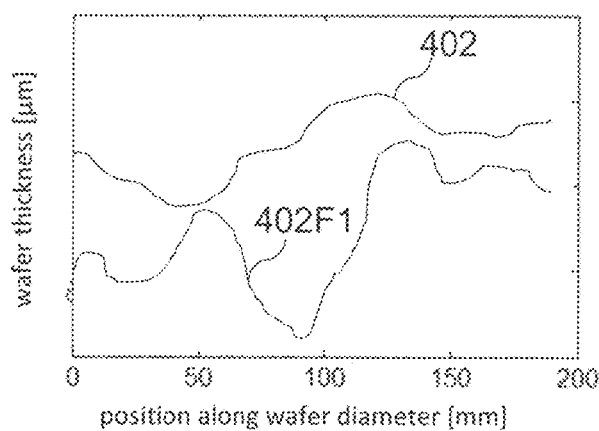
Figure 4E:
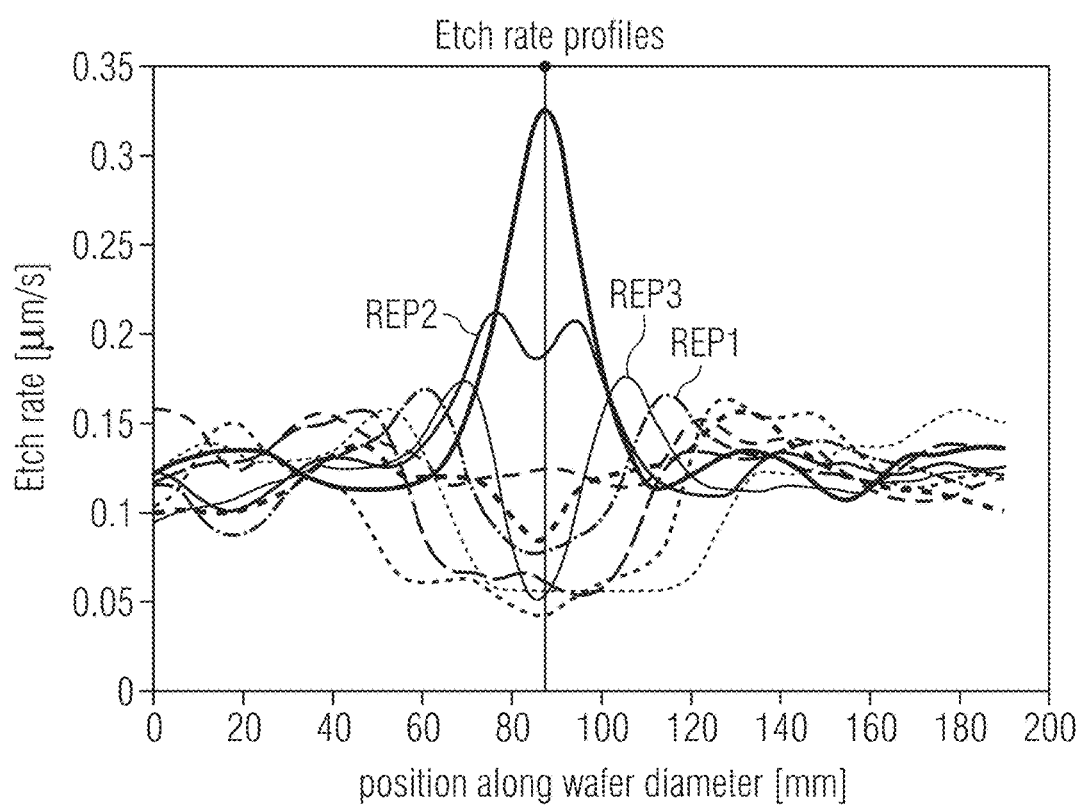

FIG. 4A-1 to FIG. 4E show a method for determining the plurality of reference etch profiles REP1, REP2, REP3 (shown in FIG. 4E) for the plurality of positions of the etchant dispenser, as disclosed in 302 of method 300.

Reference signs in FIG. 4A-1 to FIG. 4E that are the same as in FIG. 1A to FIG. 1D and FIG. 2 denote the same or similar elements as in FIG. 1A to FIG. 1D and FIG. 2. Thus, those elements will not be described in detail again here; reference is made to the description above.

FIG. 4A-1 shows a reference workpiece 404. According to some embodiments, the reference workpiece 404 may be configured in a similar or the same manner as a workpiece to be etched by the etching method (e.g. method 300). The reference workpiece 404 may be disposed on (e.g. mounted onto) a carrier 104 (e.g. glass carrier), and may be attached to the carrier 104 (e.g. glass carrier) by means of an adhesive 106 (e.g. glue).

The reference workpiece 404 may include, or may be, a reference wafer. In such an example, the reference workpiece 404 (e.g. reference wafer) may include a semiconductor substrate, which may include, or may consist of, a semiconductor material. In such an example, the reference workpiece 404 (e.g. reference wafer) may include one or more semiconductor material layers. The semiconductor material may include, or may be, at least one material selected from a group of materials, the group consisting of: silicon, germanium, gallium nitride, gallium arsenide, and silicon carbide, although other materials may be possible as well. In another example, the reference workpiece 404 may include, or may be, a reference carrier. In such an example, the reference workpiece 404 (e.g. reference carrier) may include, or may be, a glass carrier. For example, the reference workpiece 404 (e.g. reference carrier, e.g. glass carrier) may be disposed over the carrier 104. In yet another example, the reference workpiece 404 may include, or may be, a reference carrier (e.g. a glass carrier) having one or more layers (e.g. one or more semiconductor layers) disposed over the reference carrier (e.g. glass carrier). In a further example, the reference workpiece 404 may include, or may be, a reference carrier (e.g. a glass carrier) having one or more reference wafers (e.g. one or more reference semiconductor wafers) disposed over the reference carrier (e.g. glass carrier). The description that follows considers examples where the reference workpiece 404 may include, or may be, a reference wafer (e.g. reference semiconductor wafer). However, it is reiterated that the reference workpiece 404 may include, or may be, other types of reference workpiece, e.g. a reference carrier (e.g. glass carrier).

The reference workpiece 404 may include a first side 404a and a second side 404b opposite the first side 404a. The first side 404a and the second side 404b of the reference workpiece 404 may include, or may be, a frontside and a backside of the reference workpiece 404, respectively. By way of another example, the first side 404a of the reference workpiece 404 may include, or may be, an active side of the reference workpiece 404. The reference workpiece 404 may have a thickness TR, which may, for example, include, or may be, a distance between the first side 404a and the second side 404b of the reference workpiece 404.

As described above, the reference workpiece 404 may include, or may be, a reference wafer (e.g. a semiconductor wafer, e.g. a silicon wafer). In such an example, the reference workpiece 404 (e.g. reference wafer) may include at least one semiconductor device 108. Only four semiconductor devices 108 are shown as an example, however the number of semiconductor devices 108 may be less than four (e.g. one, two, three) or may be more than four, e.g. five, six, seven, eight, nine, tens, hundreds, or thousands of semiconductor devices 108. For example, the reference workpiece 404 may include a plurality of semiconductor devices 108 arranged laterally adjacent to each other and/or as a matrix of semiconductor devices 108. In another example where the reference workpiece 404 may include, or may be, a reference carrier (e.g. glass carrier), the reference workpiece 404 may not include the at least one semiconductor device 108.

The at least one semiconductor device 108 may be disposed at the first side 404a (e.g. active side) of the reference workpiece 404 (e.g. reference wafer), as shown in FIG. 4A-1. In another example, the at least one semiconductor device 108 may be disposed at the second side 404b (e.g. backside) of the reference workpiece 404 (e.g. reference wafer). The side of the reference workpiece 404 (e.g. reference wafer) at which the at least one semiconductor device 108 may be disposed may face the carrier 104.

FIG. 4A-2 shows a view of the reference workpiece 404 along the line C-C' shown in FIG. 4A-1.

Determining the plurality of reference etch profiles REP1, REP2, REP3 (shown in FIG. 4E) may include determining an initial thickness profile 402 of the reference workpiece 404 (e.g. shown in FIG. 4A-3).

As described above in respect of the thinned workpiece 102T, the thickness profile 202 shown in FIG. 2 may indicate the thickness of the thinned workpiece 102T along the line 102L passing through the center 102C of the thinned workpiece 102T. Similarly, the initial thickness profile 402 of the reference workpiece 404 shown in FIG. 4A-3 may indicate an initial thickness of the reference workpiece 404 along a line 404L passing through a center 404C of the reference workpiece 404.

The reference workpiece 404 may have at least substantially the same dimensions and/or shape as the workpiece 102. In an example where the workpiece 102 may be a circular workpiece (or an at least substantially circular workpiece), the reference workpiece 404 may be a circular workpiece (or an at least substantially circular workpiece). In such an example, the line 404L passing through the center 404C of the reference workpiece 404 may be a diameter of the reference workpiece 404, as shown in FIG. 4A-2. As described above, the workpiece 102 may include, or may be, an at least substantially radially symmetric circular workpiece, in other words a workpiece having an at least substantially radially symmetric thickness profile. Similarly, the reference workpiece 404 may include, or may be, an at least substantially radially symmetric circular workpiece.

The initial thickness profile 402 of the reference workpiece 404 may be determined (e.g. measured and/or sensed) by means of a contactless measurement process and/or a contact measurement process. For example, a contactless measurement process may include, or may be, at least one of an infrared interference measurement process, a capacitance measurement process, and an inductance measurement process, although other contactless measurement processes for determining the initial thickness profile 402 of the reference workpiece 404, may be used as well. By way of another example, a contact measurement process may include, or may be, a mechanical tweezer measurement process. In such an example, the contact measurement process may include contacting at least one side (e.g. the first side 404a and/or the second side 404b) of the reference workpiece 404 with one or more needles and/or tweezers and/or calipers. It may be noted that other contact measurement processes for determining the thickness of the reference workpiece 404, and hence, the thickness profile 402 of the reference workpiece 404, may be used as well.

As shown in FIG. 4B-1, determining the plurality of reference etch profiles REP1, REP2, REP3 may include positioning the etchant dispenser 114 over the reference workpiece 404 at a respective position (e.g. P1) of a plurality of positions P1, P2, P3, which may be at discrete positions along the path P. The plurality of positions P1, P2, P3 may be positions at which the etchant dispenser 114 may be centered whilst dispensing an etchant (see description below in respect of FIG. 4C). Accordingly, movements (e.g. slight deviations) about a respective position (e.g. P1) of the plurality of positions P1, P2, P3 may be possible whilst dispensing an etchant from the etchant dispenser 114. In another example, the plurality of positions P1, P2, P3 may be positions at which the etchant dispenser 114 may be fixed whilst dispensing the etchant. Only three positions P1, P2, P3 are shown as an example, however the number of discrete positions along the path P may be less than three, e.g. two, or may be more than three, e.g. four, five, six, seven, eight, nine, ten, or tens, or hundreds of positions P1, P2, P3. The plurality of positions P1, P2, P3 may be spaced apart from each other by some finite distance. For example, a distance (e.g. along the path P) between two adjacent positions (e.g. between positions P1 and P2) may be greater than or equal to about 1 mm, e.g. greater than or equal to about 5 mm, e.g. greater than or equal to about 1 cm, although other values may be possible as well.

A respective position (e.g. P1) of the plurality of positions P1, P2, P3 at which the etchant dispenser 114 may be positioned may be located at a respective height (e.g. H1 corresponding to position P1) over a surface of the reference workpiece 404 e.g. over the second side 404b of the reference workpiece 404. For instance, in the example shown in FIG. 4B-1, the respective position P1 may be located at a respective height H1 over the second side 404b of the reference workpiece 404. Similarly, the respective position P2 may be located at a respective height H2 over the second side 404b of the reference workpiece 404. In like manner, the respective position P3 may be located at a respective height H3 over the second side 404b of the reference workpiece 404. The respective heights corresponding to the respective positions of the plurality of positions P1, P2, P3 (e.g. H1, H2, H3, respectively) may be at least substantially equal.

FIG. 4B-2 shows a view of the workpiece 102 along the line C-C' shown in FIG. 4B-1.

As shown in FIG. 4B-2, a projection of the plurality of positions P1, P2, P3 of the etchant dispenser 114 onto a surface of the reference workpiece 404 (e.g. the second side 404b of the reference workpiece 404) may trace an arc 118 that may lie on the path P and may pass through a center 404C of the reference workpiece 404, and may be disposed laterally within the boundary B of the reference workpiece 404.

According to one or more embodiments, the plurality of positions may be located at either side of the center 404C of the reference workpiece 404. For example, referring to FIG. 4B-2, at least one of the positions may be located between the center 404C and the boundary B on that section of the arc 118 that contains P3, and at least one other of the positions may be located between the center 404C and the boundary B on that section of the arc 118 that contains P1 and P2.

According to one or more embodiments, the plurality of positions may all be located at the same side of the center 404C of the reference workpiece 404. For example, referring to FIG. 4B-2, the plurality of positions may all be located between the center 404C and the boundary B on that section of the arc 118 that contains P3, or the plurality of positions may all be located between the center 404C and the boundary B on that section of the arc 118 that contains P1 and P2.

The description that follows provides examples of determining the reference etch profile REP1 corresponding to the instance where the etchant dispenser 114 may be positioned over the reference workpiece 404 at the respective position P1 of the plurality of positions P1, P2, P3. However, the description and examples provided are analogously applicable to determining the reference etch profile REPX, corresponding to the instance where the etchant dispenser 114 may be positioned over the reference workpiece 404 at the respective position PX of the plurality of positions P1, P2, P3, where X takes values 2 or 3.

As shown in FIG. 4C, determining the reference etch profile REP1 may include dispensing the etchant 116 over the reference workpiece 404 via the etchant dispenser 114 for a predetermined reference etch duration (e.g. respective predetermined reference etch duration PD1 corresponding to respective position P1). In other words, the etchant dispenser 114 may be positioned at the respective position P1 of the plurality of positions P1, P2, P3 and may dispense the etchant 116 over the reference workpiece 404 for a respective duration of time (e.g. respective predetermined reference etch duration PD1). The reference workpiece 404 and the carrier 104 may be spun (indicated by arrow 406) while the etchant 116 is dispensed over the reference workpiece 404. As described above, the plurality of positions P1, P2, P3 may be positions at which the etchant dispenser 114 may be centered whilst dispensing an etchant. Accordingly, movements (e.g. slight deviations) about a respective position (e.g. P1) of the plurality of positions P1, P2, P3 may be possible whilst dispensing the etchant 116 from the etchant dispenser 114. For example, the etchant dispenser 116 may move laterally (e.g. move laterally slightly) to the left, the right, in front, and/or the back of the respective position (e.g. P1) of the plurality of positions P1, P2, P3. In another example, the plurality of positions P1, P2, P3 may be positions at which the etchant dispenser 114 may be fixed whilst dispensing the etchant 116.

Determining the reference etch profile REP1 may include subsequently determining a final thickness profile 402F1 (shown in FIG. 4D) of the reference workpiece 404, e.g. after etching the reference workpiece 404 with the etchant dispenser 114 positioned at the respective position P1. In other words, the final thickness profile 402F1 (shown in FIG. 4D) of the reference workpiece 404 may be determined subsequent to dispensing the etchant 116 over the reference workpiece 404 via the etchant dispenser 114 positioned at the respective position P1 of the plurality of positions P1, P2, P3. The final thickness profile 402F1 corresponding to the respective position P1 may indicate how much material of the reference workpiece 404 remains after an etching of the reference workpiece 404 by means of the etchant 116 dispensed via the etchant dispenser 114 positioned at the respective position P1. The final thickness profile 402F1 may be determined by means of any one of the aforementioned methods for determining a thickness profile of a workpiece (e.g. infrared interference measurement process).

The respective reference etch profile REP1 may be determined based on the determined initial thickness profile 402 and the respective determined final thickness profile 402F1 shown in FIG. 4D.

For example, a difference between the determined final thickness profile 402F1 and the determined initial thickness profile 402 may indicate an amount of material of the reference workpiece 404 removed along the line 404L passing through the center 404C of the reference workpiece 404 by the etchant 116 during the predetermined reference etch duration (e.g. PD1) while the etchant dispenser 114 is positioned at the respective position P1. The reference etch profile REP1 may then be determined based on this difference.

For example, the reference etch profile REP1 may include, or may be, a rate at which material is removed the reference workpiece 404 along the line 404L passing through the center 404C of the reference workpiece 404 by the etchant 116 while the etchant dispenser 114 is positioned at the respective position P1. For example, the reference etch profile REP1 may be determined by dividing the difference between the determined final thickness profile 402F 1 and the determined initial thickness profile 402 by the respective predetermined reference etch duration PD1. The reference etch profile REP1 may, for example, be expressed as µm/s, or variants thereof.

The reference etch profile REP1 may also be referred to as an etch profile, which may include, or may be, a profile indicating an amount of material that may be etched from the reference workpiece 404 (e.g., a rate at which material is etched along the line 404L) in case the etchant dispenser 114 is positioned at a respective position P1 over the reference workpiece 404 and the etchant 116 is dispensed over the reference workpiece 404 via the etchant dispenser 114. In other words, the reference etch profile REP1 may correspond to the position-dependent etch rate, i.e. the etch rate obtained for each position of the reference workpiece 404, or at least for each position of the workpiece 404 corresponding to a position on the path P, that is obtained when the reference workpiece 404 is etched with the etchant dispenser positioned at the position P1. In still other words, for a given position P1 of the etchant dispenser 114 (as a parameter), the reference etch profile REP1 may indicate the etch rate as a function of a (lateral) position PW (e.g. shown in FIG. 4B-2) on the workpiece 404. In still other words, the etch rate R may be expressed as $R=R_{P1}(PW)$.

The reference etch profile REP1, although determined from the reference workpiece 404, may provide an indication of a rate at which material may be removed from the workpiece 102 in case the etchant dispenser 114 is positioned at the respective position P1 of the plurality of positions P1, P2, P3. In other words, the reference etch profile REP1 may be used to infer an etch profile that may be obtained when material is etched from the workpiece 102 in case the etchant dispenser 114 is positioned at the respective position P1 over the workpiece 102 and the etchant 116 is dispensed over the workpiece 102 via the etchant dispenser 114.

The description above provides an example of how the reference etch profile REP1 of the plurality of reference etch profiles REP1, REP2, REP3 may be determined. The other reference etch profiles (e.g. REP2, REP3, respectively) may be determined by carrying out the process flow described above in relation to FIG. 4A-1 to FIG. 4D for each other position (e.g. P2, P3) of the plurality of positions P1, P2, P3.

FIG. 4E shows the plurality of reference etch profiles REP1, REP2, REP3 that may be determined by means of the above-described examples.

The predetermined reference etch duration (e.g. PD1, PD2, PD3) for each position of the plurality of positions P1, P2, P3 may, for example, be the same. In another example, the predetermined reference etch duration (e.g. PD1, PD2, PD3) for each position of the plurality of positions P1, P2, P3 may be the different. In either example, the reference etch profiles REP1, REP2, REP3 determined for the plurality of positions P1, P2, P3 may account for the respective predetermined reference etch durations, for example, since the plurality of reference etch profiles REP1, REP2, REP3 may include, or may be, a rate at which material is removed from the reference workpiece 404.

As described above in relation to FIG. 3, the method 300 for etching a workpiece may include: determining a thickness profile of the workpiece (in 304). In this regard, the thickness profile of the workpiece 102 may be determined by means of any one of the aforementioned methods for determining a thickness profile of a workpiece (e.g. infrared interference measurement process).

The thickness profile of the workpiece 102 may include the total thickness variations contributed to the workpiece 102 by processes performed on the workpiece prior to the etching. In other words, the thickness profile of the workpiece 102 may account for total thickness variations contributed to the workpiece 102 by processes performed on the workpiece 102 prior to the etching.

As described above in relation to FIG. 3, the method 300 for etching a workpiece may include: determining a respective etch duration for each position of the plurality of positions P1, P2, P3 of the etchant dispenser 114 based on the determined thickness profile of the workpiece 102 and the plurality of reference etch profiles REP1, REP2, REP3, to reduce a total thickness variation of the workpiece 102 (in 306).

As described above, the plurality of reference etch profiles REP1, REP2, REP3 may indicate a (position-dependent) rate at which material may be removed from the workpiece 102 by the etchant 116 while the etchant dispenser 114 is positioned at the plurality of positions P1, P2, P3. For example, the reference etch profile REP1 may indicate a (position-dependent) rate at which material may be removed from the workpiece 102 by the etchant 116 while the etchant dispenser 114 is positioned at the position P1. Similarly, the reference etch profile REP2 may indicate a (position-dependent) rate at which material may be removed from the workpiece 102 by the etchant 116 while the etchant dispenser 114 is positioned at the position P2. In like manner, the reference etch profile REP3 may indicate a (position-dependent) rate at which material may be removed from the workpiece 102 by the etchant 116 while the etchant dispenser 114 is positioned at the position P3.

The plurality of reference etch profiles REP1, REP2, REP3 may be expressed as µm/s, or variants thereof. Accordingly, a multiplication of a respective etch duration for a respective position (e.g. respective etch duration a1 for the respective position P1) and a respective reference etch profile (e.g. REP1) may indicate an amount of material that may be removed from the workpiece 102 by the etchant 116 while the etchant dispenser 114 is positioned at the respective position (e.g. P1). Consequently, a linear combination of the plurality of reference etch profiles REP1, REP2, REP3, where a respective reference etch profile (e.g. REP1, REP2, REP3, respectively) may be weighted by a respective etch duration (e.g. a1, a2, a3, respectively) may indicate a total amount of material that may be removed from the workpiece 102 along the line 102L passing through the center 102C of the workpiece 102 by the etchant 116 while the etchant dispenser 114 is positioned at the plurality of positions P1, P2, P3, respectively, for the time durations a1, a2, a3, respectively. In other words, determining the respective etch duration for each position of the plurality of positions P1, P2, P3 of the etchant dispenser 114 may include determining a linear combination of the plurality of reference etch profiles REP1, REP2, REP3, where the respective etch duration may be the respective coefficient corresponding to a respective reference etch profile of the linear combination of the plurality of reference etch profiles REP1, REP2, REP3.

As described above, the respective etch durations a1, a2, a3 may be determined to reduce a total thickness variation of the workpiece 102. The linear combination of the plurality of reference etch profiles REP1, REP2, REP3 that may reduce the total thickness variation of the workpiece 102 may, for example, be determined by means of a least square fit. In other words, to reduce the total thickness variation of the workpiece 102, the plurality of reference etch profiles REP1, REP2, REP3 may be combined by a least square fit to determine an optimum adaptive removal of material from the workpiece 102 that may reduce the total thickness variation of the workpiece 102.

In one or more embodiments, the determined etch durations a1, a2, a3 may be non-zero for all positions. In one or more embodiments, the determined etch durations a1, a2, a3 may be zero for one or more positions and at least two positions may be associated with non-zero etch durations. For example, etch duration a2 corresponding to position P2 may be determined to be zero, while etch durations a1 and a3 corresponding to positions P1 and P3, respectively, may be determined to be non-zero. This may, for example, indicate that the total thickness variation of the workpiece 102 may be reduced by means of skipping the position associated with the etch duration determined to be zero (e.g. skipping position P2) while etching the workpiece 102 for the respective etch duration (e.g. a1 and a3, respectively) while the etchant dispenser is centered about the respective position (e.g. P1 and P3, respectively).

In another embodiment, the determined etch durations a1, a2, a3 may be zero for all positions but one. For example, etch durations a1 and a2 corresponding to positions P1 and P2, respectively, may be determined to be zero, while etch duration a3 corresponding to position P3 may be determined to be non-zero. This may, for example, indicate that the total thickness variation of the workpiece 102 may be reduced by means of skipping the positions associated with the etch durations determined to be zero (e.g. skipping positions P1 and P2) while etching the workpiece 102 for the respective etch duration (e.g. a3) while the etchant dispenser is centered about the respective position (e.g. P3).

As described above in relation to FIG. 3, the method for etching the workpiece may include: dispensing the etchant 116 over the workpiece 102 via the etchant dispenser 116 for the determined respective etch duration (e.g. a1, a2, a3, respectively) for each position of the plurality of positions P1, P2, P3 (in 308).

FIG. 5A to FIG. 5D show a process flow for dispensing the etchant 116 over the workpiece 102 via the etchant dispenser 116, as disclosed in 308 of method 300.

Reference signs in FIG. 5A to FIG. 5D that are the same as in FIG. 1A to FIG. 1D, FIG. 2, and FIG. 4A-1 to FIG. 4E denote the same or similar elements as in FIG. 1A to FIG. 1D, FIG. 2, and FIG. 4A-1 to FIG. 4E. Thus, those elements will not be described in detail again here; reference is made to the description above.

Figure 5A:
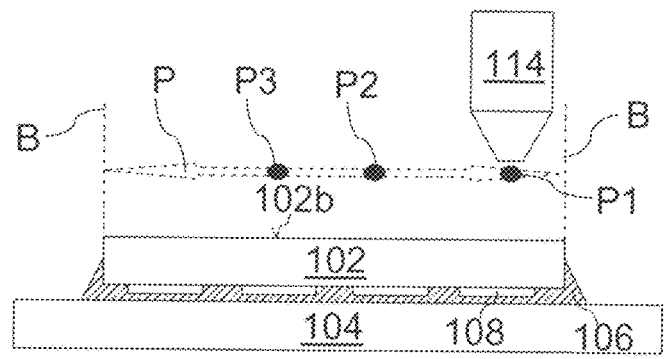
FIG. 5A to FIG. 5D show a process flow for dispensing an etchant over a workpiece via an etchant dispenser.

As shown in FIG. 5A, the etchant dispenser 116 may be moved to a first position (e.g. P1) of the plurality of positions P1, P2, P3, e.g. in an example where the respective etch duration (e.g. a1) for the first position (e.g. P1) is determined to be non-zero.

Figure 5B:
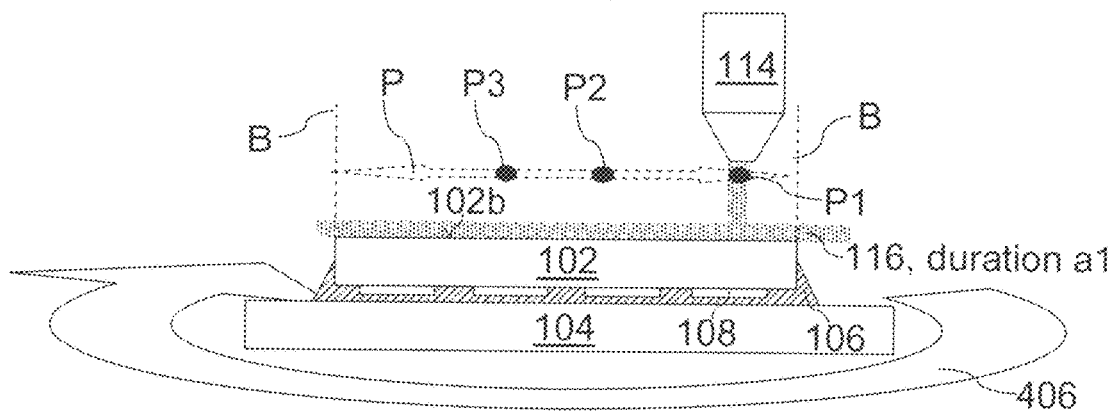

As shown in FIG. 5B, the etchant 116 may be subsequently dispensed over the workpiece 102 for a respective etch duration (e.g. a1) determined for the first position (e.g. P1), where the respective etch duration (e.g. a1) may be determined by means of a least square fit of the linear combination of the plurality of reference etch profiles REP1, REP2, REP3. As shown in FIG. 5B, the workpiece 102 may be spun (indicated by arrow 406) while the etchant 116 is dispensed over the workpiece 102. As described above, the first position (e.g. P1) may be a position at which the etchant dispenser 114 may be centered whilst dispensing the etchant 116. Accordingly, movements (e.g. small deviations) about the first position (e.g. P1) may be possible whilst dispensing the etchant 116 from the etchant dispenser 114. In another example, the first position (e.g. P1) may be a position at which the etchant dispenser 114 may be fixed whilst dispensing the etchant 116.

Figure 5C:
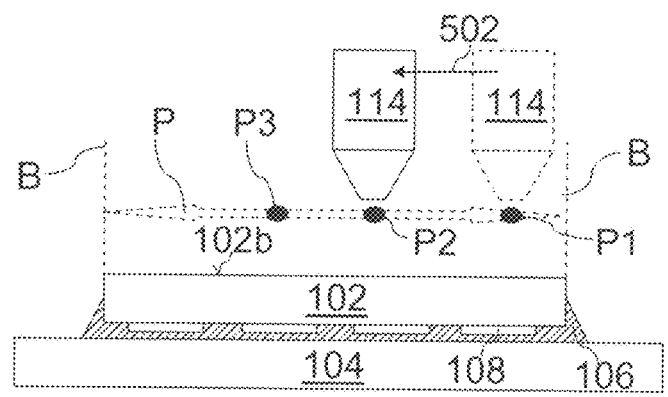

As shown in FIG. 5C, dispensing the etchant 116 over the workpiece 102 via the etchant dispenser 114 for the determined respective etch duration (e.g. a1, a2, a3, respectively) for each position of the plurality of positions P1, P2, P3 may include: subsequently moving (indicated by arrow 502) the etchant dispenser 114 from the first position (e.g. P1) to a second position (e.g. P2) of the plurality of positions P1, P2, P3, e.g. in an example where the respective etch duration (e.g. a2) for the second position (e.g. P2) is determined to be non-zero.

Figure 5D:
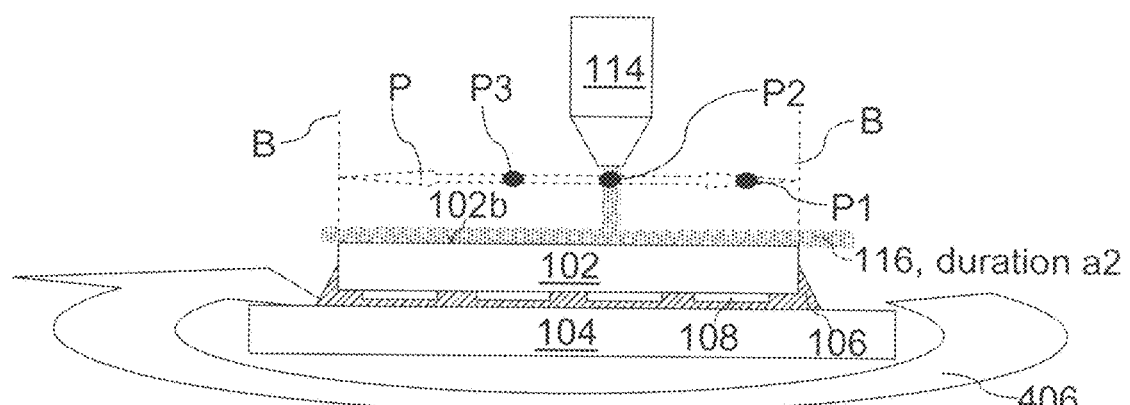

As shown in FIG. 5D, dispensing the etchant 116 over the workpiece 102 via the etchant dispenser 114 for the determined respective etch duration (e.g. a1, a2, a3, respectively) for each position of the plurality of positions P1, P2, P3 may include: subsequently dispensing the etchant 116 over the workpiece 102 for a respective etch duration (e.g. a2) determined for the second position (e.g. P2). As shown in FIG. 5D, the workpiece 102 may be spun (indicated by arrow 406) while the etchant 116 is dispensed over the workpiece 102. As described above, the second position (e.g. P2) may be a position at which the etchant dispenser 114 may be centered whilst dispensing the etchant 116. Accordingly, movements (e.g. small deviations) about the second position (e.g. P2) may be possible whilst dispensing the etchant 116 from the etchant dispenser 114. In another example, the second position (e.g. P2) may be a position at which the etchant dispenser 114 may be fixed whilst dispensing the etchant 116.

Dispensation of the etchant 116 over the workpiece 102 may be stopped while moving the etchant dispenser 114 from the first position (e.g. P1) to the second position (e.g. P2) of the plurality of positions P1, P2, P3. It may further be noted that dispensing the etchant 116 over the workpiece 102 via the etchant dispenser 116, as disclosed in 308 of method 300, may be independent of a sequence of the plurality of positions P1, P2, P3 at which the etchant dispenser 114 may be positioned. For example, the first position may be P3 and the second position may be either P1 or P2. By way of another example, the first position may be P2, and the second position may be either P1 or P3. In an example, the sequence of positions at which the etchant dispenser 114 may be positioned may correspond to a sequence that may move the etchant dispenser 114 from the edge of the workpiece 102 to the center of the workpiece 102. In another example, the sequence of positions at which the etchant dispenser 114 may be positioned may correspond to a sequence that may move the etchant dispenser 114 from the center of the workpiece 102 to the edge of the workpiece 102.

An effect provided by the method 300 for etching the workpiece 102 (e.g. as shown in FIG. 4A-1 to FIG. 4E, and FIG. 5A to FIG. 5D) may be accounting and compensating for total thickness variations contributed to the workpiece 102 by processes performed on the workpiece prior to the etching.

An effect provided by the method 300 for etching the workpiece 102 (e.g. in examples shown in FIG. 4A-1 to FIG. 4E, and FIG. 5A to FIG. 5D) may be reduction or minimization of the total thickness variation of the etched workpiece 102.

An effect provided by the method 300 for etching the workpiece 102 (e.g. in examples shown in FIG. 4A-1 to FIG. 4E, and FIG. 5A to FIG. 5D) may be that etching of the workpiece 102 may be based on the thickness profile and/or the total thickness variation of the workpiece 102 just prior to the etching.

An effect provided by the method 300 for etching the workpiece 102 (e.g. in examples shown in FIG. 4A-1 to FIG. 4E, and FIG. 5A to FIG. 5D) may be removal of material (e.g. semiconductor material) from the workpiece 102 to reduce or minimize the total thickness variation of the etched workpiece 102 based on the thickness profile and/or the total thickness variation of the workpiece 102 just prior to the etching.

An effect provided by the method 300 for etching the workpiece 102 (e.g. in examples shown in FIG. 4A-1 to FIG. 4E, and FIG. 5A to FIG. 5D) may be reduction of the total thickness variation of layers (e.g. semiconductor material layers) of the workpiece 102 (e.g. wafer).

An effect provided by the method 300 for etching the workpiece 102 (e.g. in examples shown in FIG. 4A-1 to FIG. 4E, and FIG. 5A to FIG. 5D) may be provision of a workpiece 102 that may have a thickness that may be at least substantially equal to a predetermined target thickness.

Figure 6:
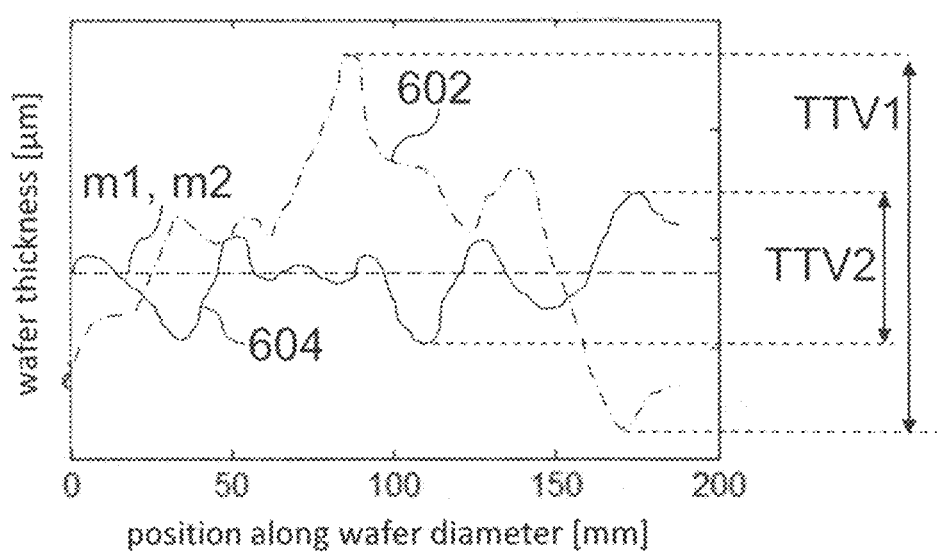
FIG. 6 shows a comparison of a first thickness profile of a workpiece and a second thickness profile of the workpiece.

FIG. 6 shows a comparison of a first thickness profile 602 of the workpiece 102 and a second thickness profile 604 of the workpiece 102.

The first and second thickness profiles 602 and 604 shown in FIG. 6 are drawn relative to their respective mean values m1, m2.

The first thickness profile 602 may include, or may be, the thickness profile of the workpiece 102 before an etching of the workpiece 102 (e.g. that may include the total thickness variations contributed to the workpiece 102 by processes performed on the workpiece 102 prior to the etching). The second thickness profile 604 may include, or may be, the thickness profile of the workpiece 102 after an etching of the workpiece 102 according to the method 300.

As shown in FIG. 6, the total thickness variation TTV1 of the workpiece 102 before etching according to the method 300 may be greater than the total thickness variation TTV2 of the workpiece 102 after etching according to the method 300. Accordingly, a significant reduction of the total thickness variation of the workpiece may be achieved by means of the method 300 for etching the workpiece 102.

For example, in accordance with one or more embodiments, a reduction of the total thickness variation may be greater than or equal to about 50%, e.g. greater than or equal to about 60%, e.g. greater than or equal to about 70%, e.g. greater than or equal to about 80%, e.g. greater than or equal to about 90%, or even more.

For example, in accordance with one or more embodiments, a total thickness variation after the etching may be less than or equal to about 2.5 µm, e.g. less than or equal to about 2.0 µm, e.g. less than or equal to about 1.5 µm, e.g. about 1.4 µm, e.g. less than or equal to about 1 µm.

Figure 7:
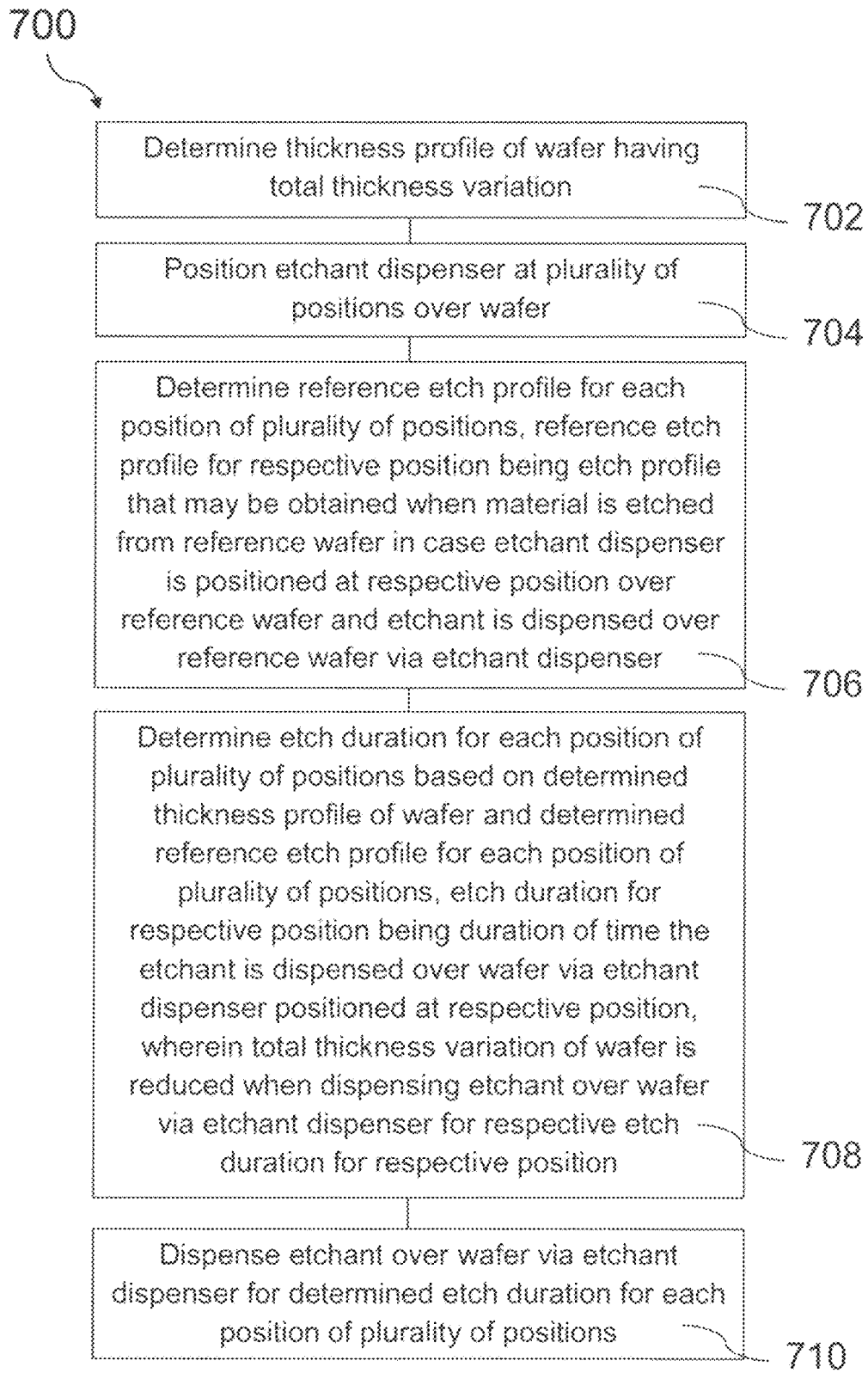
FIG. 7 shows a further method for etching a workpiece.

FIG. 7 shows a further method 700 for etching a workpiece.

The method 700 may include: determining a thickness profile of the workpiece, the workpiece having a total thickness variation (in 702); positioning an etchant dispenser at a plurality of positions over the workpiece (in 704); determining a reference etch profile for each position of the plurality of positions, the reference etch profile for a respective position being an etch profile that may be obtained when material is etched from a reference workpiece in case the etchant dispenser is positioned at the respective position over the reference workpiece and an etchant is dispensed over the reference workpiece via the etchant dispenser (in 706); determining an etch duration for each position of the plurality of positions based on the determined thickness profile of the workpiece and the determined reference etch profile for each position of the plurality of positions, the etch duration for a respective position being a duration of time the etchant is dispensed over the workpiece via the etchant dispenser positioned at the respective position, wherein the total thickness variation of the workpiece is reduced when dispensing the etchant over the workpiece via the etchant dispenser for the respective etch duration for the respective position (in 708); and dispensing the etchant over the workpiece via the etchant dispenser for the determined etch duration for each position of the plurality of positions (in 710).

As described above, the method 700 may include: determining a thickness profile of the workpiece, the workpiece having a total thickness variation (in 702), which may, for example, be identified with "determining a thickness profile of the workpiece" disclosed in 304 of method 300 shown in FIG. 3.

As described above, the method 700 may include: determining a reference etch profile for each position of the plurality of positions, the etch profile for a respective position being an etch profile that is obtained when material is etched from a reference workpiece in case the etchant dispenser is positioned at the respective position over the reference workpiece and an etchant is dispensed over the reference workpiece via the etchant dispenser (in 706), which may, for example, be identified with "determining a plurality of reference etch profiles for a plurality of positions of an etchant dispenser, each reference etch profile corresponding to a respective position of the plurality of positions of the etchant dispenser" disclosed in 302 of method 300 shown in FIG. 3.

As described above, the method 700 may include: determining an etch duration for each position of the plurality of positions based on the determined thickness profile of the workpiece and the determined reference etch profile for each position of the plurality of positions, the etch duration for a respective position being a duration of time the etchant is dispensed over the workpiece via the etchant dispenser positioned at the respective position, wherein the total thickness variation of the workpiece is reduced when dispensing the etchant over the workpiece via the etchant dispenser for the respective etch duration for the respective position (in 708), which may, for example, be identified with "determining a respective etch duration for each position of the plurality of positions of the etchant dispenser based on the determined thickness profile and the plurality of reference etch profiles, to reduce a total thickness variation of the workpiece" disclosed in 306 of method 300 shown in FIG. 3.

As described above, the method 700 may include: positioning an etchant dispenser at a plurality of positions over the workpiece (in 704) and dispensing the etchant over the workpiece via the etchant dispenser for the determined etch duration for each position of the plurality of positions (in 710), which may, for example, be identified with "dispensing an etchant over the workpiece via the etchant dispenser for the determined respective etch duration for each position of the plurality of positions" disclosed in 308 of method 300 shown in FIG. 3.

Figure 8:
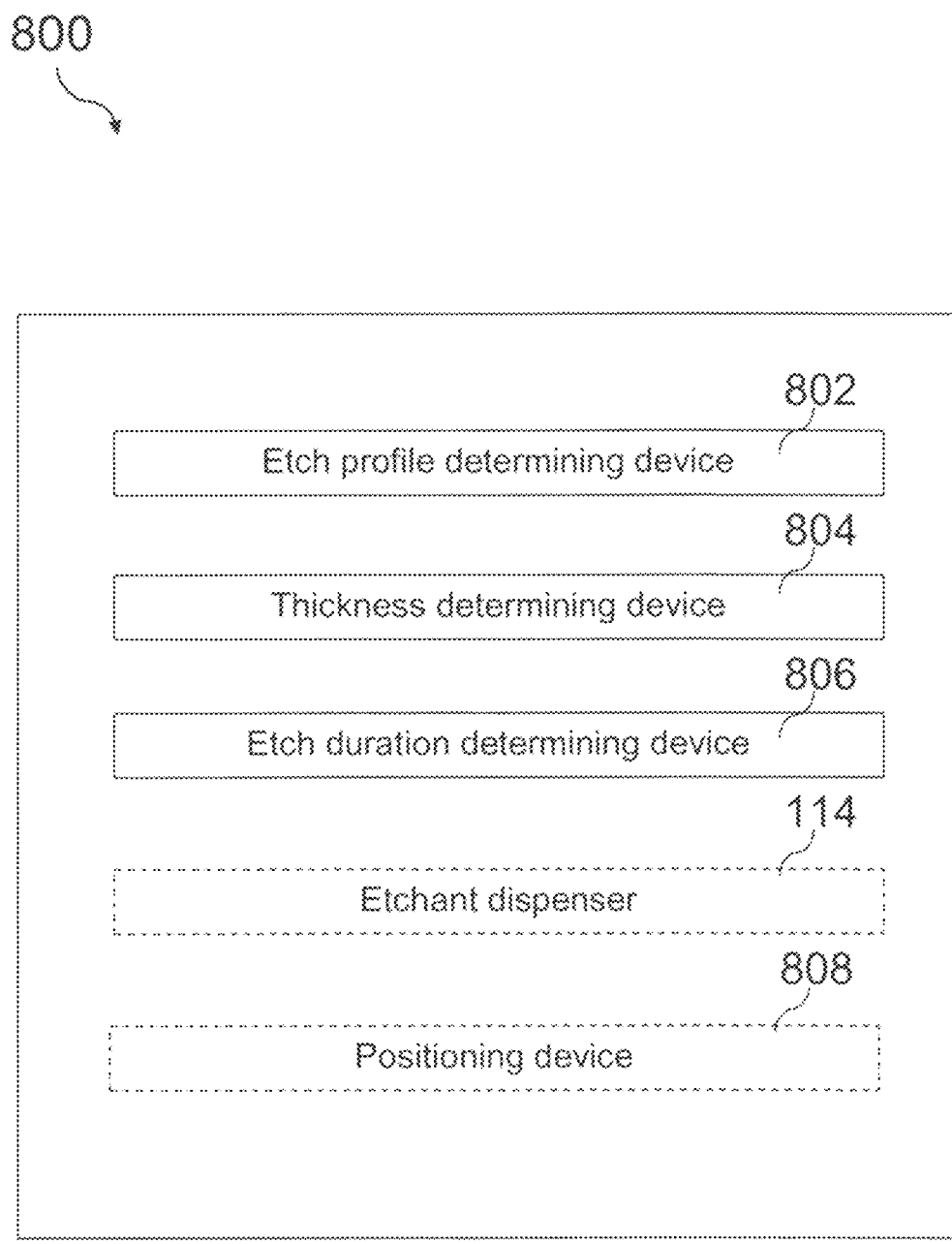
FIG. 8 shows an apparatus, which may be configured to etch a workpiece.

FIG. 8 shows an apparatus 800, which may be configured to etch a workpiece.

Reference signs in FIG. 8 that are the same as in FIG. 4A to FIG. 4E and FIG. 5A to FIG. 5D denote the same or similar elements as in FIG. 4A to FIG. 4E and FIG. 5A to FIG. 5D. Thus, those elements will not be described in detail again here; reference is made to the description above.

The apparatus 800 may, for example, be used to etch the workpiece 102 described above in relation FIG. 4A to FIG. 4E and FIG. 5A to FIG. 5D.

The apparatus 800 may include an etch profile determining device 802, a thickness determining device 804, and an etch duration determining device 806.

At least one of the etch profile determining device 802, the thickness determining device 804, and the etch duration determining device 806 may include or may be implemented by means of a circuit. The word "circuit" is used herein to mean any kind of a logic implementing entity, which may be special purpose circuitry or processor executing software stored in a memory, firmware, or any combination thereof. Thus, in one or more examples, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Different circuits can thus also be implemented by the same component, e.g. by a processor executing two different programs.

The etch profile determining device 802 may be configured to determine the plurality of reference etch profiles REP1, REP2, REP3 shown in FIG. 4A to FIG. 4E. In other words, the etch profile determining device 802 may be configured to determine the plurality of reference etch profiles REP1, REP2, REP3 for the plurality of positions P1, P2, P3 of the etchant dispenser 114, each reference etch profile corresponding to a respective position of the plurality of positions P1, P2, P3 of the etchant dispenser 114.

The thickness determining device 804 may be configured to determine the thickness profile of the workpiece 102 shown in FIG. 4A to FIG. 4E.

The etch duration determining device 806 may be configured to determine the respective etch duration (e.g. a1, a2, a3) for each position of the plurality of positions P1, P2, P3 of the etchant dispenser 114 based on the determined thickness profile and reference etch profiles REP1, REP2, REP3, to reduce a total thickness variation of the workpiece 102, as described above in relation to FIG. 3.

As described above in relation to the method 300, the etch duration determining device 806 may be configured to determine a linear combination of the plurality of reference etch profiles REP1, REP2, REP3 that may reduce the total thickness variation of the workpiece 102, where the respective etch duration (e.g. a1, a2, a3, respectively) may be a respective coefficient corresponding to a respective reference etch profile (e.g. REP1, REP2, REP3, respectively) of the linear combination of the plurality of reference etch profiles REP1, REP2, REP3.

As described above in relation to the method 300, the linear combination of the plurality of reference etch profiles REP1, REP2, REP3 that may reduce the total thickness variation of the workpiece 102 may be determined by means of a least squares fit. Accordingly, the etch duration determining device 806 may be configured to determine the linear combination of the plurality of reference etch profiles REP1, REP2, REP3 that may reduce the total thickness variation of the workpiece 102 by means of a least square fit.

The apparatus 800 may further include an etchant dispenser 114, which may be configured to dispense the etchant 116 over the workpiece 102 via the etchant dispenser 114 for the determined respective etch duration (e.g. a1, a2, a3) for each position of the plurality of positions P1, P2, P3.

The apparatus 800 may further include a positioning device 808, which may be configured to position the etchant dispenser 114 at the plurality of positions P1, P2, P3 over the workpiece 102. For example, in relation to FIG. 5A to FIG. 5D, the positioning device 808 may position the etchant dispenser 114 at the first and second positions P1, P2 and may be further configured to move the etchant dispenser 114 from the first position P1 to the second position P2.

Figure 9:
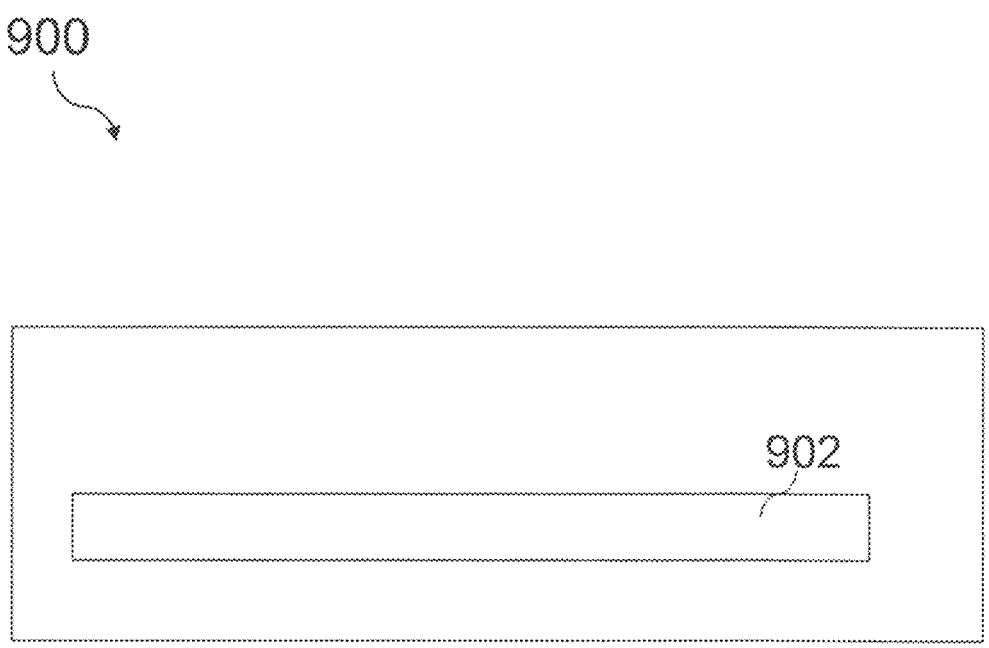
FIG. 9 shows a non-transitory computer readable medium storing a program.

FIG. 9 shows a non-transitory computer readable medium 900 storing a program 902, which may cause a computer to execute a method for etching a workpiece according to at least one of the method 300 shown in FIG. 3 and the method 700 shown in FIG. 7.

The non-transitory computer readable medium 900 may, for example, be executed by a computer that may be a part of, or that may control, the apparatus 800 shown in FIG. 8.

According to various examples presented herein, a method for etching a workpiece may be provided. The method may include: determining a plurality of reference etch profiles for a plurality of positions of an etchant dispenser, each reference etch profile corresponding to a respective position of the plurality of positions of the etchant dispenser; determining a thickness profile of the workpiece; determining a respective etch duration for each position of the plurality of positions of the etchant dispenser based on the determined thickness profile and the plurality of reference etch profiles, to reduce a total thickness variation of the workpiece; and dispensing an etchant over the workpiece via the etchant dispenser for the determined respective etch duration for each position of the plurality of positions.

The workpiece may include or may be a wafer, e.g. a semiconductor wafer, e.g. a silicon wafer.

The workpiece may include or may be a carrier, e.g. a glass carrier.

The reference etch profile corresponding to the respective position may include, or may be, an etch profile that may be obtained when material is etched from a reference workpiece in case the etchant dispenser is positioned at the respective position over the reference workpiece and the etchant is dispensed over the reference workpiece via the etchant dispenser.

Determining the thickness profile of the workpiece may include determining a thickness of the workpiece along a line passing through a center of the workpiece.

The workpiece may include, or may be, a circular workpiece, and the line passing through the center of the workpiece may be a diameter of the circular workpiece.

The circular workpiece may include, or may be, an at least substantially radially symmetric circular workpiece.

Determining the thickness profile of the workpiece may include at least one of a contactless measurement process and/or a contact measurement process.

The contactless measurement process may include, or may be, an infrared interference measurement process, a capacitance measurement process, and an inductance measurement process.

The contact measurement process may include, or may be, a mechanical tweezer measurement process.

Determining the plurality of reference etch profiles for the plurality of positions of the etchant dispenser may include: a) determining an initial thickness profile of a reference workpiece; b) positioning the etchant dispenser over the reference workpiece at a respective position of the plurality of positions; c) dispensing the etchant over the reference workpiece via the etchant dispenser for a predetermined reference etch duration; d) subsequently determining a final thickness profile of the reference workpiece; e) determining the reference etch profile from the determined initial thickness profile and the determined final thickness profile; and f) carrying out a)-e) for each position of the plurality of positions.

Determining the reference etch profile from the determined initial thickness profile and the determined final thickness profile may include calculating the difference between the final thickness profile and the initial thickness profile.

The method may further include: spinning the reference workpiece while dispensing the etchant over the reference workpiece.

At least one of the workpiece and the reference workpiece may include, or may consist of, a semiconductor material.

A projection of the plurality of positions of the etchant dispenser onto a surface of the workpiece may trace an arc passing through a center of the workpiece and disposed laterally within a boundary of the workpiece.

Dispensing the etchant over the workpiece may include: moving the etchant dispenser to a first position of the plurality of positions; subsequently dispensing the etchant over the workpiece for a respective etch duration determined for the first position; subsequently moving the etchant dispenser from the first position to a second position of the plurality of positions; and subsequently dispensing the etchant over the workpiece for a respective etch duration determined for the second position, wherein dispensing the etchant over the workpiece may be stopped while moving the etchant dispenser from the first position to the second position of the plurality of positions.

A respective position of the plurality of positions of the etchant dispenser may be located at a respective height over a surface of the workpiece, where the respective heights corresponding to the respective positions of the plurality of positions may be at least substantially equal.

Determining the respective etch duration for each position of the plurality of positions of the etchant dispenser based on the determined thickness profile and reference etch profiles may include: determining a linear combination of the plurality of reference etch profiles that may reduce the total thickness variation of the workpiece, the respective etch duration being a respective coefficient corresponding to a respective reference etch profile of the linear combination of the plurality of reference etch profiles.

Determining the linear combination of the plurality of reference etch profiles that may reduce the total thickness variation of the workpiece may include a least square fit.

The method may further include: spinning the workpiece while dispensing the etchant over the workpiece.

According to various examples presented herein, a method for etching a workpiece may be provided. The method may include: determining a thickness profile of the workpiece, the workpiece having a total thickness variation; positioning an etchant dispenser at a plurality of positions over the workpiece; determining a reference etch profile for each position of the plurality of positions, the reference etch profile for a respective position being an etch profile that may be obtained when material is etched from a reference workpiece in case the etchant dispenser is positioned at the respective position over the reference workpiece and an etchant is dispensed over the reference workpiece via the etchant dispenser; determining an etch duration for each position of the plurality of positions based on the determined thickness profile of the workpiece and the determined reference etch profile for each position of the plurality of positions, the etch duration for a respective position being a duration of time the etchant is dispensed over the workpiece via the etchant dispenser positioned at the respective position, wherein the total thickness variation of the workpiece may be reduced when dispensing the etchant over the workpiece via the etchant dispenser for the respective etch duration for the respective position; and dispensing the etchant over the workpiece via the etchant dispenser for the determined etch duration for each position of the plurality of positions.

A projection of the plurality of positions of the etchant dispenser onto a surface of the workpiece may trace an arc passing through a center of the workpiece and disposed laterally within a boundary of the workpiece.

A respective position of the plurality of positions of the etchant dispenser may be located at a respective height over a surface of the workpiece, the respective heights corresponding to the respective positions of the plurality of positions being at least substantially equal.

Determining the etch duration for each position of the plurality of positions based on the thickness profile of the workpiece and the reference etch profile for each position of the plurality of positions may include determining a linear combination of the reference etch profiles of the plurality of positions that may reduce the total thickness variation of the workpiece, the etch duration for each position of the plurality of positions being a respective coefficient corresponding to a respective reference etch profile of the reference etch profiles of the plurality of positions.

Determining the linear combination of the reference etch profiles of the plurality of positions that may reduce the total thickness variation of the workpiece may include a least square fit.

According to various examples presented herein, an apparatus configured to etch a workpiece may be provided. The apparatus may include: an etch profile determining device configured to determine a plurality of reference etch profiles for a plurality of positions of an etchant dispenser, each reference etch profile corresponding to a respective position of the plurality of positions of the etchant dispenser; a thickness determining device configured to determine a thickness profile of the workpiece; and an etch duration determining device configured to determine a respective etch duration for each position of the plurality of positions of the etchant dispenser based on the determined thickness profile and reference etch profiles, to reduce a total thickness variation of the workpiece.

The apparatus may further include: the etchant dispenser, the etchant dispenser configured to dispense an etchant over the workpiece via the etchant dispenser for the determined respective etch duration for each position of the plurality of positions.

The apparatus may further include: a positioning device configured to position the etchant dispenser at the plurality of positions over the workpiece.

The etch duration determining device may be configured to determine a linear combination of the plurality of reference etch profiles that reduces the total thickness variation of the workpiece, the respective etch duration being a respective coefficient corresponding to a respective reference etch profile of the linear combination of the plurality of reference etch profiles.

The etch duration determining device may be configured to determine the linear combination of the plurality of reference etch profiles that may reduce the total thickness variation of the workpiece by means of a least square fit.

According to various examples presented herein, a non-transitory computer readable medium storing a program causing a computer to execute a method for etching a workpiece may be provided. The method may include: determining a plurality of reference etch profiles for a plurality of positions of an etchant dispenser, each reference etch profile corresponding to a respective position of the plurality of positions of the etchant dispenser; determining a thickness profile of the workpiece; determining a respective etch duration for each position of the plurality of positions of the etchant dispenser based on the determined thickness profile and reference etch profiles, to reduce a total thickness variation of the workpiece; and dispensing an etchant over the workpiece via the etchant dispenser for the determined respective etch duration for each position of the plurality of positions.

Various examples and aspects described in the context of one of the methods, apparatuses, or non-transitory computer readable media described herein may be analogously valid for the other methods, apparatuses, or non-transitory computer readable media described herein.

FIG. 10 shows a flow diagram 1000 that shows an example of a method for etching a workpiece.

As shown in FIG. 10, the flow diagram 1000 may include a workpiece conditioning process (in 1002). The workpiece conditioning process (in 1002) may include an etching process (e.g. a spin-etch process, as indicated in 1002) that may at least substantially smooth out a rough surface of the workpiece, which may, for example be a result of a grinding process performed on the workpiece.

As shown in FIG. 10, the flow diagram 1000 may include measuring a thickness of the workpiece (in 1004), e.g. subsequent to conditioning the workpiece (in 1002). Measuring the thickness of the workpiece (in 1004), may, for example, include, or may be, determining a thickness profile of the workpiece, e.g. as described above. The thickness (e.g. thickness profile) of the workpiece may, for example, be determined by means of the thickness determining device 804 shown in FIG. 8. As an example, the thickness determining device 804 may be a device manufactured by ISIS Sentronics (indicated as "ISIS thickness measurement" in 1004).

As shown in FIG. 10, the flow diagram 1000 may include a mathematical treatment (in 1006). The mathematical treatment (in 1006) may include determining a respective etch duration for each position of the plurality of positions of an etchant dispenser (e.g. a boom) based on the determined thickness profile of the workpiece (in 1004) and a plurality of reference etch profiles (e.g. determined by means of the etch profile determining device 802 shown in the apparatus 800 of FIG. 8). The mathematical treatment (in 1006) may be applied to reduce a total thickness variation of the workpiece. The mathematical treatment (in 1006) may be performed by means of the etch duration determining device 806 shown in the apparatus 800 of FIG. 8.

As shown in FIG. 10, the mathematical treatment (in 1006) may include sending data to a host (in 1006a), which may, for example, be at least a part of the etch duration determining device 806. The mathematical treatment (in 1006) may include calculating etch times for boom positions (in 1006b). As described above, the etch times may be calculated by means of a least square fit, which may reduce a total thickness variation of the workpiece. The mathematical treatment 1006 may include manipulating a standard etch process for each workpiece (in 1006c). The standard etch process is also indicated as a "standard recipe" in 1006c, while each workpiece is also indicated as "each slot" in 1006c. The mathematical treatment (in 1006) may include sending the recipes (in 1006d), e.g. in a slot-wise manner to an etchant dispenser (indicated as the word "Tool" in 1006d).

As shown in FIG. 10, the flow diagram 1000 may include an adaptive spin etch (in 1008), which may etch the workpiece, e.g. in accordance with the calculated etch times for the boom positions (in 1006b). As shown in FIG. 10, the flow diagram 1000 may include a second thickness measurement (in 1010), which may determine the thickness profile of the etched workpiece. As an example, the second thickness measurement (in 1010) may be determined by the thickness determining device 804, which may be a device manufactured by ISIS Sentronics (indicated as "ISIS thickness measurement" in 1010). The second thickness measurement (in 1010) may, for example, verify the success of the method and/or process described above. For example, the second thickness measurement (in 1010) may provide a total thickness variation of the workpiece after the adaptive spin etch (in 1008). This may allow a comparison of the total thickness variation of the workpiece prior to (e.g. in 1004) and after (e.g. in 1010) the adaptive spin etch (in 1008).

While various aspects have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. An apparatus configured to etch a workpiece, the apparatus comprising:
   an etchant dispenser configured to dispense an etchant at a plurality of positions;
   an etch profile determining circuit configured to determine a plurality of reference etch profiles, each reference etch profile corresponding to a respective position of the plurality of positions based on the etchant effects continuously across a reference workpiece corresponding to the etchant dispensed at the respective position;

a thickness determining circuit configured to determine a thickness profile of the workpiece, the thickness profile indicates the thicknesses of the workpiece continuously across the workpiece; and an etch duration determining circuit configured to determine a respective etch duration for each position of the plurality of positions of the etchant dispenser based on the determined thickness profile and the plurality of reference etch profiles, to reduce a total thickness variation of the workpiece, each etch duration corresponding to a respective position of the plurality of positions.

2. The apparatus of claim 1, further comprising:
a positioning device configured to position the etchant dispenser at the plurality of positions over the workpiece.

3. The apparatus of claim 1, wherein the etch duration determining circuit is configured to determine a linear combination of the plurality of reference etch profiles that reduces the total thickness variation of the workpiece, the respective etch duration being a respective coefficient corresponding to a respective reference etch profile of the linear combination of the plurality of reference etch profiles.

4. The apparatus of claim 3, wherein the etch duration determining circuit is configured to determine the linear combination of the plurality of reference etch profiles that reduces the total thickness variation of the workpiece by means of a least square fit.

5. The apparatus of claim 1, wherein the respective reference etch profile corresponding to the respective position comprises an etch profile that is obtained when material is etched from the reference workpiece in case the etchant dispenser is positioned at the respective position over the reference workpiece and the etchant is dispensed over the reference workpiece via the etchant dispenser.

6. The apparatus of claim 1, wherein the thickness determining circuit is configured to determine a thickness profile of the workpiece using at least one of a contactless measurement process and a contact measurement process.

7. The apparatus of claim 1, wherein the etch profile determining circuit is configured to:
a) determine an initial thickness profile of the reference workpiece indicating the thicknesses of the reference workpiece continuously across the reference workpiece;
b) position the etchant dispenser over the reference workpiece at a respective position of the plurality of positions;
c) dispense the etchant over the reference workpiece via the etchant dispenser for a predetermined reference etch duration corresponding to the respective position;
d) subsequently determine a final thickness profile of the reference workpiece indicating the thicknesses of the reference workpiece continuously across the reference workpiece;
e) determine a respective reference etch profile corresponding to the respective position from the determined initial thickness profile and the determined final thickness profile; and
f) carry out a)-e) for each position of the plurality of positions.

8. The apparatus of claim 7, wherein e) comprises:
calculating the difference between the final thickness profile and the initial thickness profile and dividing by the predetermined reference etch duration corresponding to the respective position.

9. The apparatus of claim 7, wherein the apparatus is further configured to spin the reference workpiece while dispensing the etchant over the reference workpiece.

10. The apparatus of claim 7, wherein each etch reference profile is an etch rate determined continuously across the reference workpiece based on the final thickness profile, the initial thickness profile, and the predetermined reference etch duration corresponding to the respective position.

11. The apparatus of claim 1, wherein a projection of the plurality of positions of the etchant dispenser onto a surface of the workpiece traces an arc passing through a center of the workpiece and disposed laterally within a boundary of the workpiece.

12. The apparatus of claim 1, wherein the apparatus is further configured to:
move the etchant dispenser to a first position of the plurality of positions;
subsequently dispense the etchant over the workpiece for a respective etch duration determined for the first position;
subsequently move the etchant dispenser from the first position to a second position of the plurality of positions;
subsequently dispense the etchant over the workpieces for a respective etch duration determined for the second position; and
the apparatus is further configured to stop dispensing the etchant over the workpiece while moving the etchant dispenser from the first position to the second position of the plurality of positions.

13. The apparatus of claim 1, wherein a respective position of the plurality of positions of the etchant dispenser is located at a respective height over a surface of the workpiece, the respective heights corresponding to the respective positions of the plurality of positions being at least substantially equal.

14. The apparatus of claim 1, wherein each reference etch profile is based on the etch rate of the reference workpiece determined continuously along a line passing through the center of the reference workpiece.

15. The apparatus of claim 1, wherein each thickness profile is based on the thicknesses of the workpiece determined continuously along a line passing through the center of the workpiece.

16. The apparatus of claim 15, wherein the workpiece is a circular workpiece, and wherein the line passing through the center of the workpiece is a diameter of the circular workpiece.

17. The apparatus of claim 1, wherein each reference etch profile is based on the amount of material removed from the reference workpiece determined continuously along a line passing through the center of the reference workpiece.

18. An apparatus for etching a workpiece, the apparatus comprising:
a thickness determining circuit for determining a thickness profile of the workpiece, the thickness profile based on the thicknesses of the workpiece continuously across the workpiece, the workpiece having a total thickness variation;
an etchant dispenser for dispensing an etchant over the workpiece via the etchant dispenser;
a positioning device for positioning the etchant dispenser at a plurality of positions over the workpiece;
an etch profile determining circuit for determining a reference etch profile for each position of the plurality of positions, the reference etch profile for a respective position being a continuous etch profile that is obtained when material is etched from a reference workpiece in case the etchant dispenser is positioned at the respective position over the reference workpiece and an etchant is dispensed over the reference workpiece via the etchant dispenser; and an etch duration determining circuit for determining an etch duration for each position of the plurality of positions based on the determined thickness profile of the workpiece and the determined reference etch profile for each position of the plurality of positions, the determined etch duration for a respective position being a duration of time the etchant is dispensed over the workpiece via the etchant dispenser positioned at the respective position, wherein the total thickness variation of the workpiece is reduced when dispensing the etchant over the workpiece via the etchant dispenser for the respective etch duration for the respective position.

\* \* \* \* \*